(12) United States Patent
Sommer et al.

(10) Patent No.: US 8,145,984 B2
(45) Date of Patent: Mar. 27, 2012

(54) READING MEMORY CELLS USING MULTIPLE THRESHOLDS

(75) Inventors: Naftali Sommer, Rishon Lezion (IL); Ofir Shalvi, Ra'anana (IL); Dotan Sokolov, Ra'anana (IL)

(73) Assignee: Anobit Technologies Ltd., Herzliya (IL)

( * ) Notice: Subject to any disclaimer, the term of this patent is extended or adjusted under 35 U.S.C. 154(b) by 0 days.

(21) Appl. No.: 13/114,049

(22) Filed: May 24, 2011

(65) Prior Publication Data

US 2011/0225472 A1    Sep. 15, 2011

Related U.S. Application Data

(63) Continuation of application No. 11/995,814, filed as application No. PCT/IL2007/001315 on Oct. 30, 2007, now Pat. No. 7,975,192.

(60) Provisional application No. 60/863,506, filed on Oct. 30, 2006, provisional application No. 60/867,399, filed on Nov. 28, 2006, provisional application No. 60/888,828, filed on Feb. 8, 2007, provisional application No. 60/889,277, filed on Feb. 11, 2007, provisional application No. 60/892,869, filed on Mar. 4, 2007, provisional application No. 60/894,456, filed on Mar. 13, 2007, provisional application No. 60/917,653, filed on May 12, 2007, provisional application No. 60/950,884, filed on Jul. 20, 2007, provisional application No. 60/951,215, filed on Jul. 22, 2007.

(51) Int. Cl.
  *G06F 11/10* (2006.01)
  *G06F 11/30* (2006.01)

(52) U.S. Cl. ........................................ 714/797; 714/719

(58) Field of Classification Search ........................ None
  See application file for complete search history.

(56) References Cited

U.S. PATENT DOCUMENTS 3,668,631 A    6/1972    Griffith et al.
(Continued)

FOREIGN PATENT DOCUMENTS

EP    0783754 B1    7/1997
(Continued)

OTHER PUBLICATIONS

Agrell et al., "Closest Point Search in Lattices", IEEE Transactions on Information Theory, vol. 48, No. 8, pp. 2201-2214, Aug. 2002.
(Continued)

*Primary Examiner* — Jeffrey A Gaffin
*Assistant Examiner* — Dipakkumar Gandhi
(74) *Attorney, Agent, or Firm* — D. Kligler IP Services Ltd

(57) ABSTRACT

A method for operating a memory (28) includes storing data, which is encoded with an Error Correction Code (ECC), in analog memory cells (32) of the memory by writing respective analog input values selected from a set of nominal values to the analog memory cells. The stored data is read by performing multiple read operations that compare analog output values of the analog memory cells to different, respective read thresholds so as to produce multiple comparison results for each of the analog memory cells. At least two of the read thresholds are positioned between a pair of the nominal values that are adjacent to one another in the set of the nominal values. Soft metrics are computed responsively to the multiple comparison results. The ECC is decoded using the soft metrics, so as to extract the data stored in the analog memory cells.

33 Claims, 8 Drawing Sheets

U.S. PATENT DOCUMENTS

| | | |
|---|---|---|
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotra et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,541,886 A | 7/1996 | Hasbun |
| 5,600,677 A | 2/1997 | Citta et al. |
| 5,638,320 A | 6/1997 | Wong et al. |
| 5,657,332 A * | 8/1997 | Auclair et al. ............ 714/763 |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koening |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |

| | | |
|---|---|---|
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |
| 6,879,520 B2 | 4/2005 | Hosono et al. |
| 6,882,567 B1 | 4/2005 | Wong |
| 6,894,926 B2 | 5/2005 | Guterman et al. |
| 6,907,497 B2 | 6/2005 | Hosono et al. |
| 6,925,009 B2 | 8/2005 | Noguchi et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,958,938 B2 | 10/2005 | Noguchi et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 6,999,344 B2 | 2/2006 | Hosono et al. |
| 7,002,843 B2 | 2/2006 | Guterman et al. |
| 7,006,379 B2 | 2/2006 | Noguchi et al. |
| 7,012,835 B2 | 3/2006 | Gonzales et al. |
| 7,020,017 B2 | 3/2006 | Chen et al. |
| 7,023,735 B2 * | 4/2006 | Ban et al. .................. 365/185.2 |
| 7,031,210 B2 | 4/2006 | Park et al. |
| 7,031,214 B2 | 4/2006 | Tran |
| 7,031,216 B2 | 4/2006 | You |
| 7,039,846 B2 * | 5/2006 | Hewitt et al. .................. 714/755 |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,072,222 B2 | 7/2006 | Ishii et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,145,805 B2 | 12/2006 | Ishii et al. |
| 7,151,692 B2 | 12/2006 | Wu |
| 7,170,781 B2 | 1/2007 | So et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzales et al. |
| 7,177,199 B2 | 2/2007 | Chen et al. |
| 7,177,200 B2 | 2/2007 | Ronen et al. |
| 7,184,338 B2 | 2/2007 | Nakakawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,644 B1 | 3/2007 | Anderson et al. |
| 7,196,928 B2 | 3/2007 | Chen |
| 7,196,933 B2 | 3/2007 | Shibata |
| 7,197,594 B2 | 3/2007 | Raz et al. |
| 7,200,062 B2 | 4/2007 | Kinsely et al. |
| 7,210,077 B2 | 4/2007 | Brandenberger et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,254,763 B2 | 8/2007 | Aadsen et al. |
| 7,257,027 B2 | 8/2007 | Park |
| 7,259,987 B2 | 8/2007 | Chen et al. |
| 7,266,026 B2 | 9/2007 | Gongwer et al. |
| 7,266,069 B2 | 9/2007 | Chu |
| 7,269,066 B2 | 9/2007 | Nguyen et al. |
| 7,272,757 B2 | 9/2007 | Stocken |
| 7,274,611 B2 | 9/2007 | Roohparvar |
| 7,277,355 B2 | 10/2007 | Tanzana |
| 7,280,398 B1 | 10/2007 | Lee et al. |
| 7,280,409 B2 | 10/2007 | Misumi et al. |
| 7,280,415 B2 | 10/2007 | Hwang et al. |
| 7,283,399 B2 | 10/2007 | Ishii et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,269 B2 | 12/2007 | Shibata |
| 7,310,271 B2 | 12/2007 | Lee |
| 7,310,272 B1 | 12/2007 | Mokhlesi et al. |
| 7,310,347 B2 | 12/2007 | Lasser |
| 7,321,509 B2 | 1/2008 | Chen et al. |
| 7,328,384 B1 | 2/2008 | Kulkarni et al. |
| 7,342,831 B2 | 3/2008 | Mokhlesi et al. |
| 7,343,330 B1 | 3/2008 | Boesjes et al. |
| 7,345,924 B2 | 3/2008 | Nguyen et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,365,671 B1 | 4/2008 | Anderson |
| 7,388,781 B2 | 6/2008 | Litsyn et al. |
| 7,397,697 B2 | 7/2008 | So et al. |
| 7,405,974 B2 | 7/2008 | Yaoi et al. |
| 7,405,979 B2 | 7/2008 | Ishii et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,409,623 B2 | 8/2008 | Baker et al. |
| 7,420,847 B2 | 9/2008 | Li |
| 7,433,231 B2 | 10/2008 | Aritome |
| 7,433,697 B2 | 10/2008 | Karaoguz et al. |
| 7,434,111 B2 | 10/2008 | Sugiura et al. |
| 7,437,498 B2 | 10/2008 | Ronen |
| 7,440,324 B2 | 10/2008 | Mokhlesi |
| 7,440,331 B2 | 10/2008 | Hemink |
| 7,441,067 B2 | 10/2008 | Gorobetz et al. |
| 7,447,970 B2 | 11/2008 | Wu et al. |
| 7,450,421 B2 | 11/2008 | Mokhlesi et al. |
| 7,453,737 B2 | 11/2008 | Ha |
| 7,457,163 B2 | 11/2008 | Hemink |
| 7,457,897 B1 | 11/2008 | Lee et al. |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,471,581 B2 | 12/2008 | Tran et al. |
| 7,483,319 B2 | 1/2009 | Brown |
| 7,487,329 B2 | 2/2009 | Hepkin et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |
| 7,590,002 B2 | 9/2009 | Mokhlesi et al. |
| 7,593,259 B2 | 9/2009 | Kim |

| Patent/Publication | Date | Name |
|---|---|---|
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,810,017 B2 | 10/2010 | Radke |
| 7,848,149 B2 | 12/2010 | Gonzales et al. |
| 7,869,273 B2 | 1/2011 | Lee et al. |
| 7,885,119 B2 | 2/2011 | Li |
| 7,924,613 B1 | 4/2011 | Sommer |
| 7,925,936 B1 | 4/2011 | Sommer |
| 7,928,497 B2 | 4/2011 | Yaegashi |
| 7,930,515 B2 | 4/2011 | Gupta et al. |
| 7,945,825 B2 | 5/2011 | Cohen et al. |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1* | 11/2007 | Cornwell et al. ........ 365/185.28 |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |

| | | |
|---|---|---|
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0124088 A1 | 5/2010 | Shalvi et al. |
| 2010/0131697 A1 | 5/2010 | Alrod et al. |
| 2010/0131827 A1 | 5/2010 | Sokolov et al. |
| 2010/0142268 A1 | 6/2010 | Aritome |
| 2010/0142277 A1 | 6/2010 | Yang et al. |
| 2010/0157675 A1 | 6/2010 | Shalvi et al. |
| 2010/0165689 A1 | 7/2010 | Rotbard et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0195390 A1 | 8/2010 | Shalvi |
| 2010/0199150 A1 | 8/2010 | Shalvi et al. |
| 2010/0220509 A1 | 9/2010 | Sokolov et al. |
| 2010/0220510 A1 | 9/2010 | Shalvi |
| 2010/0250836 A1 | 9/2010 | Sokolov et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009074006 A2 | 6/2009 |
| WO | 2009095902 A2 | 8/2009 |
| WO | 2011024015 A1 | 3/2011 |

OTHER PUBLICATIONS

Ankolekar et al., "Multibit Error-Correction Methods for Latency-Constrained Flash Memory Systems", IEEE Transactions on Device and Materials Reliability, vol. 10, No. 1, pp. 33-39, Mar. 2010.

Berman et al., "Mitigating Inter-Cell Coupling Effects in MLC NAND Flash via Constrained Coding", Flash Memory Summit, Santa Clara, USA, Aug. 19, 2010.

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Compaq et al., "Universal Serial Bus Specification", revision 2.0, Apr. 27, 2000.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in Flash", pp. 115-118, Proceedings of the IEEE 2002 Custom Integrated Circuits Conference, May 12-15, 2002.

Engineering Windows 7, "Support and Q&A for Solid-State Drives", e7blog, May 5, 2009.

Goodman et al., "On-Chip ECC for Multi-Level Random Access Memories," Proceedings of the IEEE/CAM Information Theory Workshop, Ithaca, USA, Jun. 25-29, 1989.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, p. 103-112, Springer Berlin / Heidelberg, Aug. 25, 2006.

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

Horstein, "On the Design of Signals for Sequential and Nonsequential Detection Systems with Feedback," IEEE Transactions on Information Theory IT-12:4 (Oct. 1966), pp. 448-455.

How to Resolve Bad Super Block: Magic Number Wrong"in BSD", Free Online Articles Director Article Base, posted Sep. 5, 2009.

Huffman, A., "Non-Volatile Memory Host Controller Interface (NVMHCI)", Specification 1.0, Apr. 14, 2008.

Jedec Standard JESD84-C44, "Embedded MultiMediaCard (eMMC) Mechanical Standard, with Optional Reset Signal", Jedec Solid State Technology Association, USA, Jul. 2009.

Jedec, "UFS Specification", version 0.1, Nov. 11, 2009.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Micron Technology Inc., "Memory Management in NAND Flash Arrays", Technical Note, year 2005.

Numonyx, "M25PE16: 16-Mbit, page-erasable serial flash memory with byte-alterability, 75 MHz SPI bus, standard pinout", Apr. 2008.

Onfi, "Open NAND Flash Interface Specification," revision 1.0, Dec. 28, 2006.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

Park et al., "Sub-Grouped Superblock Management for High-Performance Flash Storages", IEICE Electronics Express, vol. 6, No. 6, pp. 297-303, Mar. 25, 2009.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

SD Group and SD Card Association, "SD Specifications Part 1 Physical Layer Specification", version 3.01, draft 1.00, Nov. 9, 2009.

Serial ATA International Organization, "Serial ATA Revision 3.0 Specification", Jun. 2, 2009.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Super User Forums, "SD Card Failure, can't read superblock", posted Aug. 8, 2010.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Takeuchi et al., "A Multipage Cell Architecture for High-Speed Programming Multilevel NAND Flash Memories", IEEE Journal of Solid State Circuits, vol. 33, No. 8, Aug. 1998.

Ubuntu Forums, "Memory Stick Failed IO Superblock", posted Nov. 11, 2009.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Search Report dated May 30, 2008.

International Application PCT/IL2007/000576 Search Report dated Jul. 7, 2008.

International Application PCT/IL2007/000579 Search report dated Jul. 3, 2008.

International Application PCT/IL2007/000580 Search Report dated Sep. 11, 2008.

International Application PCT/IL2007/000581 Search Report dated Aug. 25, 2008.

International Application PCT/IL2007/001059 Search report dated Aug. 7, 2008.

International Application PCT/IL2007/001315 search report dated Aug. 7, 2008.

International Application PCT/IL2007/001316 Search Report dated Jul. 22, 2008.

International Application PCT/IL2007/001488 Search Report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

U.S. Appl. No. 11/949,135 Official Action dated Oct. 2, 2009.
U.S. Appl. No. 12/019,011 Official Action dated Nov. 20, 2009.
U.S. Appl. No. 11/957,970 Official Action dated May 20, 2010.
U.S. Appl. No. 12/171,797 Official Action dated Aug. 25, 2010.
U.S. Appl. No. 11/945,575 Official Action dated Aug. 24, 2010.
U.S. Appl. No. 12/497,707 Official Action dated Sep. 15, 2010.
U.S. Appl. No. 11/995,801 Official Action dated Oct. 15, 2010.
U.S. Appl. No. 12/045,520 Official Action dated Nov. 16, 2010.
U.S. Appl. No. 12/388,528 Official Action dated Nov. 29, 2010.
U.S. Appl. No. 11/995,814 Official Action dated Dec. 17, 2010.
U.S. Appl. No. 12/251,471 Official Action dated Jan. 3, 2011.

U.S. Appl. No. 12/534,898 Official Action dated Mar. 23, 2011.
Chinese Application # 200780026181.3 Official Action dated Apr. 8, 2011.
U.S. Appl. No. 12/178,318 Official Action dated May 31, 2011.
U.S. Appl. No. 11/995,813 Official Action dated Jun. 16, 2011.
U.S. Appl. No. 12/344,233 Official Action dated Jun. 24, 2011.
U.S. Appl. No. 12/251,471, filed Oct. 15, 2008.
U.S. Appl. No. 12/534,893, filed Aug. 4, 2009.
U.S. Appl. No. 12/534,898, filed Aug. 4, 2009.
U.S. Appl. No. 12/551,583, filed Sep. 1, 2009.
U.S. Appl. No. 12/551,567, filed Sep. 1, 2009.
U.S. Appl. No. 12/558,528, filed Sep. 13, 2009.
U.S. Appl. No. 12/579,430, filed Oct. 15, 2009.
U.S. Appl. No. 12/579,432, filed Oct. 15, 2009.
U.S. Appl. No. 12/607,078, filed Oct. 28, 2009.
U.S. Appl. No. 12/607,085, filed Oct. 28, 2009.
U.S. Appl. No. 12/649,358, filed Dec. 30, 2009.
U.S. Appl. No. 12/649,360, filed Dec. 30, 2009.
U.S. Appl. No. 12/688,883, filed Jan. 17, 2010.
U.S. Appl. No. 12/728,296, filed Mar. 22, 2010.
U.S. Appl. No. 12/758,003, filed Apr. 11, 2010.
U.S. Appl. No. 12/880,101, filed Sep. 12, 2010.
U.S. Appl. No. 12/890,724, filed Sep. 27, 2010.
U.S. Appl. No. 12/822,207, filed Jun. 24, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
U.S. Appl. No. 13/170,202, filed Jun. 28, 2011.
U.S. Appl. No. 13/171,467, filed Jun. 29, 2011.
U.S. Appl. No. 13/176,761, filed Jul. 6, 2011.
Wei, L., "Trellis-Coded Modulation With Multidimensional Constellations", IEEE Transactions on Information Theory, vol. IT-33, No. 4, pp. 483-501, Jul. 1987.
U.S. Appl. No. 12/649,360 Official Action dated Aug. 9, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 13/192,495, filed Jul. 28, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed on Oct. 30, 2011.
U.S. Appl. No. 13/284,913, filed on Oct. 30, 2011.
U.S. Appl. No. 13/338,335, filed on Dec. 28, 2011.
U.S. Appl. No. 13/355,536, filed on Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
US 7,161,836, 01/2007, Wan et al. (withdrawn)

* cited by examiner

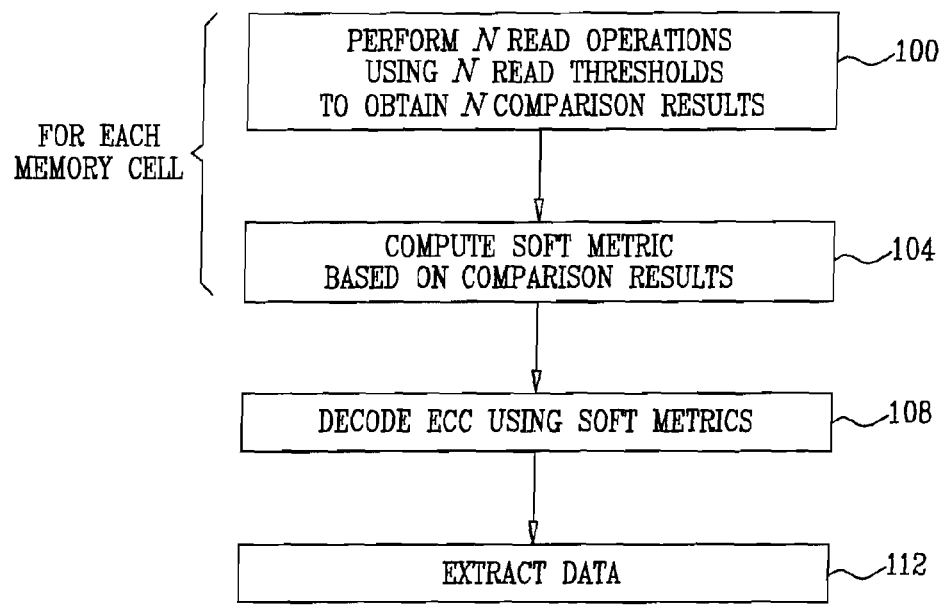
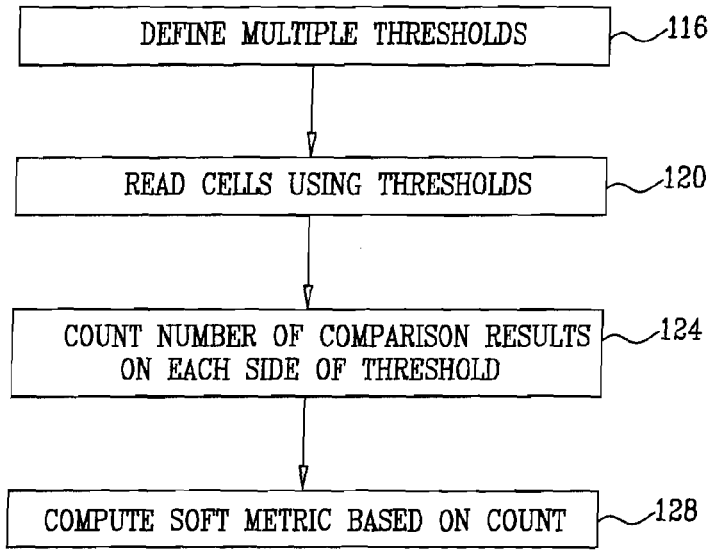

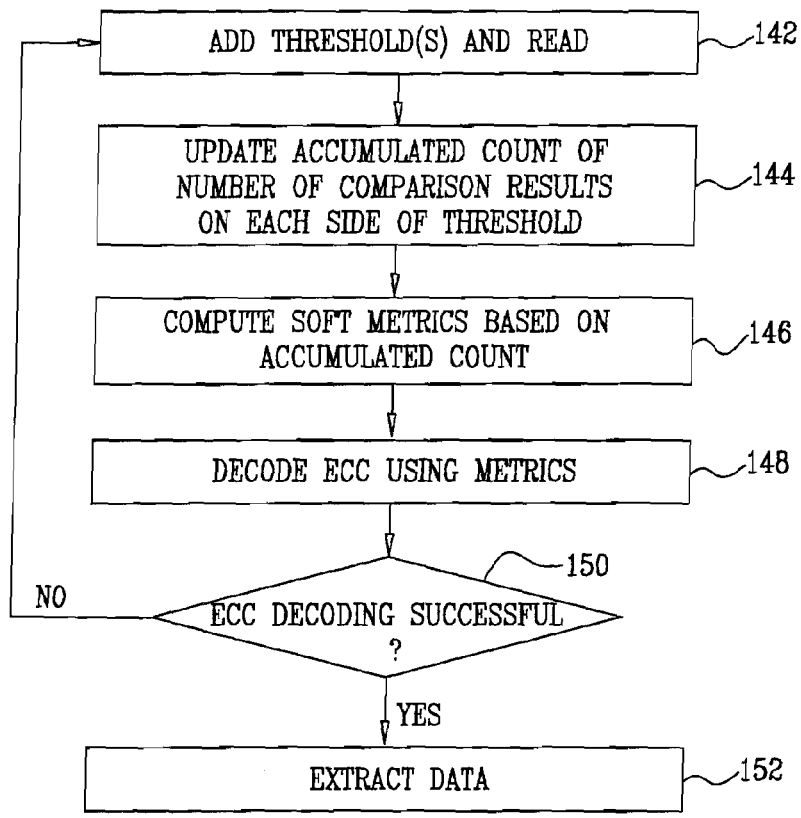
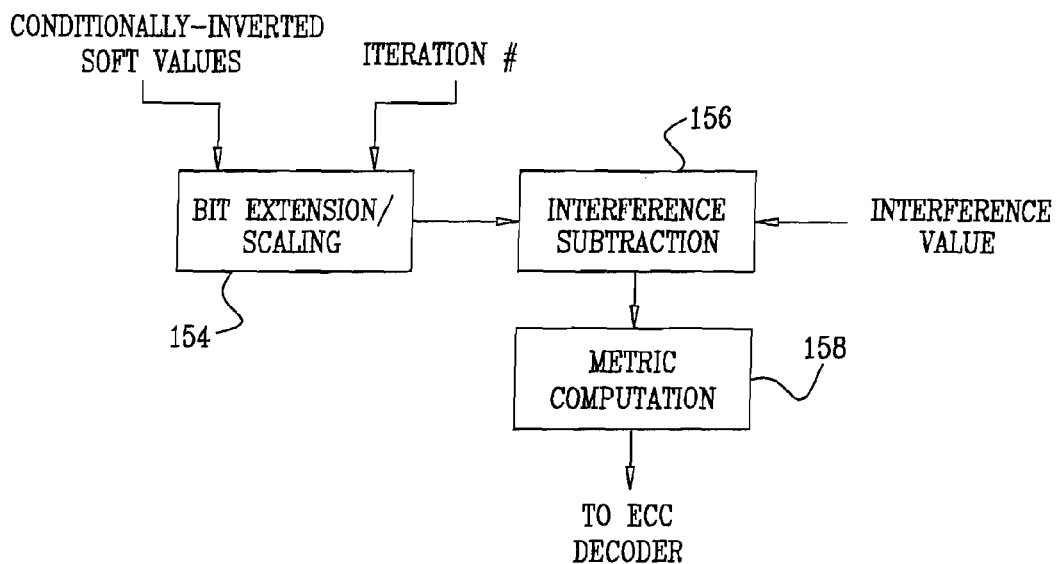

READING MEMORY CELLS USING MULTIPLE THRESHOLDS

CROSS-REFERENCE TO RELATED APPLICATIONS

This application is a continuation of U.S. patent application Ser. No. 11/995,814, which claims the benefit of U.S. Provisional Patent Application 60/863,506, filed Oct. 30, 2006, U.S. Provisional Patent Application 60/867,399, filed Nov. 28, 2006, U.S. Provisional Patent Application 60/888, 828, filed Feb. 8, 2007, U.S. Provisional Patent Application 60/889,277, filed Feb. 11, 2007, U.S. Provisional Patent Application 60/892,869, filed Mar. 4, 2007, U.S. Provisional Patent Application 60/894,456, filed Mar. 13, 2007, U.S. Provisional Patent Application 60/917,653, filed May 12, 2007, U.S. Provisional Patent Application 60/950,884, filed Jul. 20, 2007, and U.S. Provisional Patent Application 60/951,215, filed Jul. 22, 2007. The disclosures of all these related applications are incorporated herein by reference.

FIELD OF THE INVENTION

The present invention relates generally to memory devices, and particularly to methods and systems for reading data from memory cells.

BACKGROUND OF THE INVENTION

Several types of memory devices, such as Flash memories, use arrays of analog memory cells for storing data. Each analog memory cell stores a quantity of an analog value, such as an electrical charge or voltage, which represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits. The possible bit values that can be stored in an analog memory cell are also referred to as the memory states of the cell.

Some memory devices, commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

The analog values read from analog memory cells are sometimes distorted. The distortion may be due to various reasons, such as electrical field coupling from neighboring memory cells, disturb noise caused by memory access operations on other cells in the array and threshold voltage drift caused by device aging. Some common distortion mechanisms are described in the article by Bez et al., cited above. Distortion effects are also described by Lee et al., in "Effects of Floating Gate Interference on NAND Flash Memory Cell Operation," IEEE Electron Device Letters, (23:5), May, 2002, pages 264-266, which is incorporated herein by reference.

Reading data from analog memory cells often involves comparing the analog values stored in the cells to one or more thresholds, or reference levels. Several methods for determining the appropriate threshold values are known in the art. For example, U.S. Pat. No. 5,657,332, whose disclosure is incorporated herein by reference, describes methods for recovering from hard errors in a solid-state memory system. Hard errors may arise from cells whose threshold voltages drifted from their intended level to cause read errors. The memory system includes an array of memory cells, each cell capable of having its threshold voltage programmed or erased to an intended level. An error checking scheme is provided for each of a plurality of groups of cells for identifying read errors therein. A read reference level is adjusted before each read operation on the individual group of cells containing read errors, each time the read reference level being displaced a predetermined step from a reference level for normal read, until the error checking means no longer indicates read errors. The drifted threshold voltage of each cell associated with a read error is re-written to its intended level.

U.S. Pat. No. 7,023,735, whose disclosure is incorporated herein by reference, describes methods for reading Flash memory cells, which, in addition to comparing the threshold voltages of Flash cells to integral reference voltages, compare the threshold voltages to fractional reference voltages.

U.S. Patent Application Publication 2007/0091677, whose disclosure is incorporated herein by reference, describes methods, devices and computer readable code for reading data from one or more flash memory cells, and for recovering from read errors. In some embodiments, in the event of an error correction failure by an error detection and correction module, the flash memory cells are re-read at least once using one or more modified reference voltages, until successful error correction may be carried out. In some embodiments, after successful error correction, a subsequent read request is handled without re-writing data to the flash memory cells in the interim.

U.S. Pat. No. 6,963,505, whose disclosure is incorporated herein by reference, describes a method, circuit and system for determining a reference voltage. In some embodiments a set of operating reference cells is established to be used in operating cells in a Non-Volatile Memory (NVM) block or array. At least a subset of cells of the NVM block or array may be read using each of two or more sets of test reference cells, where each set of test reference cells may generate or otherwise provide reference voltages at least slightly offset from each other set of test reference cells. For each set of test reference cells used to read at least a subset of the NVM block, a read error rate may be calculated or otherwise determined. A set of test reference cells associated with a relatively low read error rate may be selected as the set of operating reference cells to be used in operating other cells, outside the subset of cells, in the NVM block or array.

U.S. Pat. No. 7,196,928 and U.S. patent Application Publications 2006/0221692, 2007/0103986, 2007/0109845 and 2007/0109849, whose disclosures are incorporated herein by reference, describe several processes for reading a memory cell, which take into account the programmed state of an adjacent memory cell.

Some known methods use information regarding the quality of stored data when reading the data from memory cells. For example, U.S. Pat. No. 6,751,766, whose disclosure is incorporated herein by reference, describes several methods for assessing the quality of data stored in a memory system, and for operating the memory system according to the assessed quality. The data quality is sometimes assessed during read operations. Subsequent use of an Error Correction Code (ECC) can utilize the quality indications to detect and reconstruct the data with improved effectiveness. Alternatively, a statistics of data quality can be constructed and digital data values can be associated in a modified manner to prevent data corruption.

SUMMARY OF THE INVENTION

Embodiments of the present invention provide a method for operating a memory, including:

storing data, which is encoded with an Error Correction Code (ECC), in analog memory cells of the memory by writing respective analog input values selected from a set of nominal values to the analog memory cells;

reading the stored data by performing multiple read operations that compare analog output values of the analog memory cells to different, respective read thresholds so as to produce multiple comparison results for each of the analog memory cells, wherein at least two of the read thresholds are positioned between a pair of the nominal values that are adjacent to one another in the set of the nominal values;

computing soft metrics responsively to the multiple comparison results; and decoding the ECC using the soft metrics, so as to extract the data stored in the analog memory cells.

In some embodiments, each of the analog memory cells stores one or more bits of the data, and each of the soft metrics corresponds to one of the bits. In an embodiment, each of at least some of the analog memory cells stores two or more bits of the data, reading the data includes, for each of the at least some of the analog memory cells, reading the two or more data bits in respective two or more decoding stages, and computing the soft metrics includes modifying a soft metric of a first bit read in a first decoding stage responsively to a value of a second bit read in a second decoding stage that precedes the first decoding stage. Modifying the soft metric may include conditionally inverting the soft metric of the first bit depending on the value of the second bit.

In another embodiment, the method includes making an initial attempt to decode the ECC using an initial set of the read thresholds, such that no more than one of the read thresholds in the initial set is positioned between each pair of the nominal values that are adjacent to one another, and comparing the analog output values to the multiple read thresholds upon a failure of the initial attempt.

In yet another embodiment, each comparison result has one of first and second possible values, and computing the soft metrics includes determining respective first and second counts of the comparison results having the first and second possible values, and computing the soft metrics based on the first and second counts.

In still another embodiment, the method further includes, upon failing to decode the ECC, adding one or more additional read thresholds to the multiple read thresholds, re-computing the soft metrics responsively to the additional read thresholds, and decoding the ECC using the re-computed soft metrics. Adding the additional threshold may include progressively increasing a number of the read thresholds until a predetermined condition is met.

In a disclosed embodiment, reading the data from a first group of the analog memory cells further includes estimating interference caused to the first group by a second group of the analog memory cells and canceling the estimated interference. Canceling the estimated interference may include modifying the soft metrics associated with the first group responsively to the estimated interference. In some embodiments, the method includes, upon failing to decode the ECC in the first group, selecting whether to perform one of:

re-reading the data in the second group, so as to re-estimate and cancel the interference;

re-estimating the interference by reading the data in a third group of the memory cells; and adding one or more additional read thresholds and re-reading the data in the first group using the additional read thresholds.

In an embodiment, computing the soft metrics includes normalizing the soft metrics so as not to depend on a number of the read thresholds. Performing the multiple read operations may include positioning the multiple read thresholds at non-uniform intervals with respect to one another.

There is additionally provided, in accordance with an embodiment of the present invention, a data storage apparatus, including:

an interface, which is operative to communicate with a memory that includes a plurality of analog memory cells; and a memory signal processor (MSP), which is connected to the interface and is coupled to store data, which is encoded with an Error Correction Code (ECC), in the analog memory cells by writing respective input analog values selected from a set of nominal values to the analog memory cells, to read the stored data by performing multiple read operations that compare analog output values of the analog memory cells to different, respective read thresholds so as to produce multiple comparison results for each of the analog memory cells, wherein at least two of the read thresholds are positioned between a pair of the nominal values that are adjacent to one another in the set of the nominal values, to compute soft metrics responsively to the multiple comparison results, and to decode the ECC using the soft metrics, so as to extract the data stored in the analog memory cells.

There is also provided, in accordance with an embodiment of the present invention, a data storage apparatus, including:

a memory device, including:

a plurality of analog memory cells, which are configured to store data, which is encoded with an Error Correction Code (ECC) and written to the analog memory cells as respective analog input values selected from a set of nominal values; and reading circuitry, which is coupled to read the stored data by performing multiple read operations that compare output analog values of the analog memory cells to different, respective read thresholds so as to produce multiple comparison results for each of the analog memory cells, wherein at least two of the read thresholds are positioned between a pair of the nominal values that are adjacent to one another in the set of the nominal values, to compute soft metrics responsively to the multiple comparison results, and to output the computed soft metrics; and a Memory Signal Processor (MSP) device, which is connected to the memory device and is coupled to accept the soft metrics computed by the reading circuitry, and to decode the ECC using the soft metrics.

There is further provided, in accordance with an embodiment of the present invention, a method for operating a memory, including:

storing data, which is encoded with an Error Correction Code (ECC), in analog memory cells of the memory by writing respective analog input values to the analog memory cells;

reading the stored data by comparing analog output values of the analog memory cells to a set of read thresholds, so as to produce multiple comparison results for each of the analog memory cells;

computing soft metrics responsively to the multiple comparison results;

decoding the ECC using the soft metrics, so as to extract the data stored in the analog memory cells; and upon a failure to successfully extract the data, extending the set of the read thresholds by adding one or more new read thresholds to the set, updating the multiple comparison results based on the extended set of the read thresholds, re-computing the soft metrics and re-decoding the ECC, so as to extract the data.

In an embodiment, extending the set of the read thresholds includes selecting the one or more new read thresholds responsively to the output analog values of the analog memory cells. Selecting the one or more new read thresholds may include determining at least one property selected from a group of properties consisting of a number of the new read thresholds and values of the new read thresholds.

The present invention will be more fully understood from the following detailed description of the embodiments thereof, taken together with the drawings in which:

BRIEF DESCRIPTION OF THE DRAWINGS

FIG. 5 is a flow chart that schematically illustrates a method for reading data from analog memory cells, in accordance with an embodiment of the present invention;

FIG. 6 is a flow chart that schematically illustrates a method for computing soft metrics, in accordance with an embodiment of the present invention;

FIG. 8 is a flow chart that schematically illustrates a method for reading data from analog memory cells, in accordance with another embodiment of the present invention;

FIG. 9 is a diagram that schematically illustrates a process for reading data from analog memory cells, in accordance with yet another embodiment of the present invention;

DETAILED DESCRIPTION OF EMBODIMENTS

Overview

Embodiments of the present invention provide improved methods and systems for reading data from analog memory cells, such as Flash memory cells. In some embodiments that are described hereinbelow, a Memory Signal Processor (MSP) stores data, which is encoded with an Error Correction Code (ECC), in an array of analog memory cells. The MSP stores the encoded data by writing respective analog values to the analog memory cells. The analog values are selected from a set of nominal analog values, which represent the data.

The MSP reads the data from the analog memory cells by performing multiple read operations, which compare the analog values written to the cells to multiple read thresholds. The read thresholds are set so that at least two of them are positioned between a pair of adjacent nominal analog values. The multiple threshold comparisons produce multiple comparison results for each of the analog memory cells. The MSP computes soft metrics based on the multiple comparison results. The soft metrics provide quantitative measures of the levels of confidence or certainty that are associated with the values read from the memory cells, or of individual bits within the memory cells. The MSP decodes the ECC using the soft metrics. In some embodiments, the MSP increases the number of read thresholds in an iterative manner, until successful decoding is achieved.

Some known reading methods differentiate between adjacent memory states using a single threshold at any given time. Unlike these known methods, the methods and systems described herein perform multiple read operations using multiple thresholds, which are positioned between adjacent memory states. Typically, multiple thresholds are positioned in boundary regions between adjacent nominal values, so that the multiple comparison results convey valuable information regarding the statistical distribution of the analog values in these regions. As a result, the soft metrics, which are based on this information, enable the ECC decoding process to correct a higher number of read errors and to provide an improved overall error probability.

Some known reading methods modify the threshold values in order to improve decoding performance. Unlike these known methods, the methods and systems described herein do not adapt the threshold values, but rather add new thresholds to the existing set, and improve the decoding performance by refining the accuracy of the soft metrics.

The improved decoding performance achieved by the disclosed methods and systems enables improving the data storage reliability, storage density and retention time of memory devices, and enables lowering the memory device cost and complexity for a given performance level.

System Description

Figure 1:
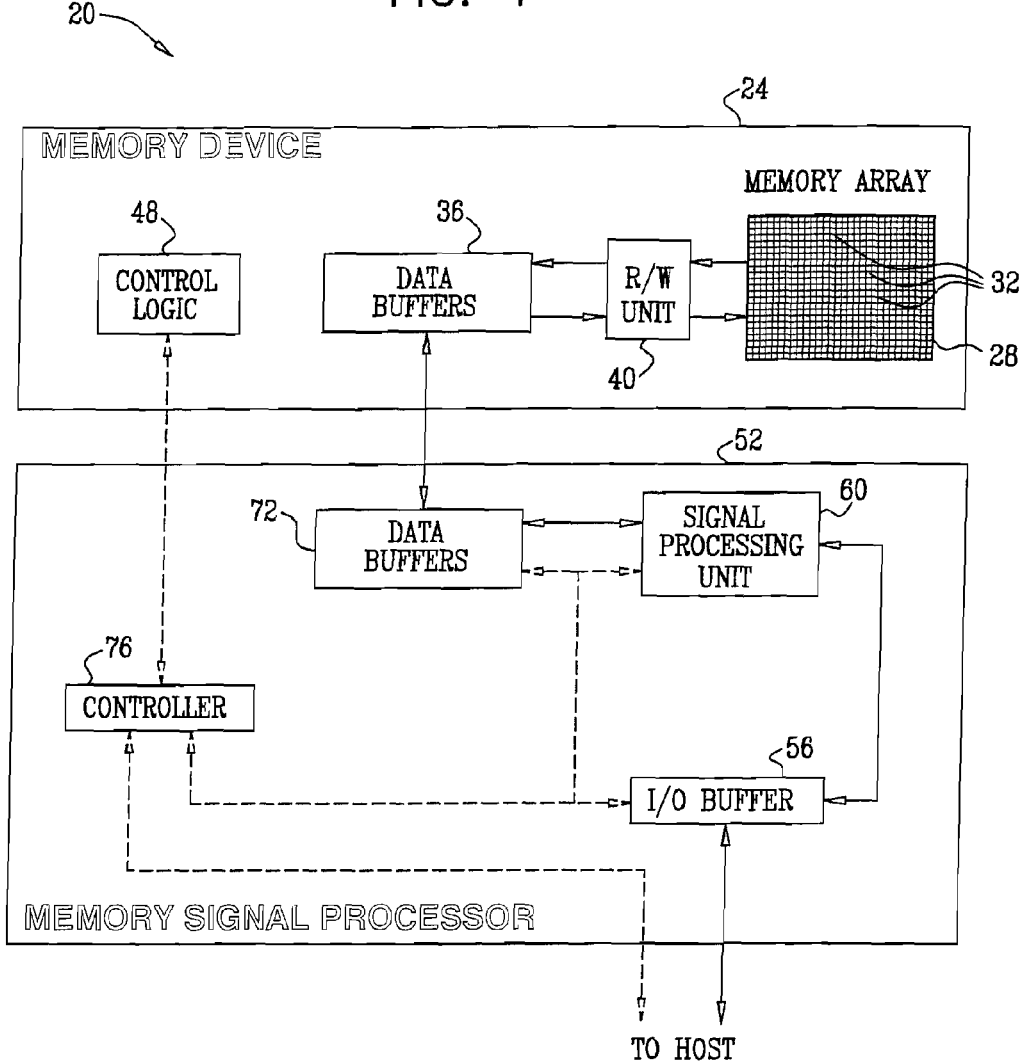
FIG. 1 is a block diagram that schematically illustrates a system for memory signal processing, in accordance with an embodiment of the present invention.

FIG. 1 is a block diagram that schematically illustrates a system 20 for memory signal processing, in accordance with an embodiment of the present invention. System 20 can be used in various host systems and devices, such as in computing devices, cellular phones or other communication terminals, removable memory modules ("disk-on-key" devices), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. The charge levels stored in the cells and/or the analog voltages or currents written into and read out of the cells are referred to herein collectively as analog values.

System 20 stores data in the analog memory cells by programming the cells to assume respective memory states. The memory states are selected from a finite set of possible states, and each state corresponds to a certain nominal analog value. For example, a 2 bit/cell MLC can be programmed to assume one of four possible memory states by writing one of four possible nominal analog values into the cell.

Data for storage in memory device 24 is provided to the device and cached in data buffers 36. The data is then converted to analog voltages and written into memory cells 32 using a reading/writing (R/W) unit 40, whose functionality is described in greater detail below. When reading data out of array 28, R/W unit 40 converts the electrical charge, and thus the analog voltages of memory cells 32, into digital samples having a resolution of one or more bits. The samples are cached in buffers 36. The operation and timing of memory device 24 is managed by control logic 48.

The storage and retrieval of data in and out of memory device 24 is performed by a Memory Signal Processor (MSP) 52. MSP 52 comprises a signal processing unit 60, which processes the data that is written into and read from device 24. Unit 60 encodes the data to be written into the memory cells using an Error Correction Code (ECC), and decodes the ECC of the retrieved data.

In particular, MSP 52 reads data out of memory cells 32 by comparing the values read from the cells to multiple read thresholds. The ECC decoding scheme used by unit 60 operates on soft metrics, which are computed based on the multiple threshold comparisons. Exemplary methods for reading data and for computing soft metrics are described in detail below.

Many known ECC decoding schemes can accept soft metrics of the encoded bits or symbols as input. For example, unit 60 may use a block code such as the Bose-Chaudhuri-Hocquenghem (BCH) code, Low-Density Parity Check (LDPC) code or Reed-Solomon (RS) code, a trellis code, a turbo-code, or any other suitable ECC and decoding scheme, which is able to operate on soft metrics. The methods and systems described herein are not limited to block codes and can be used with convolutional codes, as well.

MSP 52 comprises a data buffer 72, which is used by unit 60 for storing data and for interfacing with memory device 24. MSP 52 also comprises an Input/Output (I/O) buffer 56, which forms an interface between the MSP and the host system. A controller 76 manages the operation and timing of MSP 52. Signal processing unit 60 and controller 76 may be implemented in hardware. Alternatively, unit 60 and/or controller 76 may comprise microprocessors that run suitable software, or a combination of hardware and software elements.

The configuration of FIG. 1 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 52 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which memory array 28 is disposed. An exemplary configuration of this sort is described in FIG. 11 below. Further alternatively, some or all of the functionality of MSP 52 can be implemented in software and carried out by a processor or other element of the host system. In some implementations, a single MSP 52 may be connected to multiple memory devices 24. Additional architectural aspects of certain embodiments of system 20 are described in greater detail in U.S. Provisional Patent Application 60/867,399, cited above.

In a typical writing operation, data to be written into memory device 24 is accepted from the host and cached in I/O buffer 56. The data is transferred, via data buffers 72, to memory device 24. The data may be pre-processed by MSP 52 before it is transferred to the memory device for programming. For example, unit 60 may encode the data using an ECC, add certain data for internal use, and/or scramble the data. In device 24 the data is temporarily stored in buffers 36. R/W unit 40 converts the data to nominal analog values and writes the nominal values into the appropriate cells 32 of array 28.

In a typical reading operation, R/W unit 40 reads analog values out of the appropriate memory cells 32 and converts them to soft digital samples. The samples are cached in buffers 36 and transferred to buffers 72 of MSP 52. In some embodiments, unit 60 of MSP 52 converts the samples to data bits. As noted above, the range of possible analog values is divided into two or more regions, with each region representing a certain combination of one or more data bits.

As will be described in greater detail further below, the memory cells are read by comparing their analog values to multiple sets of read thresholds. For each cell, the MSP computes a soft metric based on the multiple comparison results. The soft metrics are then used by the MSP when decoding the ECC. The decoded data is transferred via I/O buffer 56 to the host system.

Memory Array Structure

Figure 2:
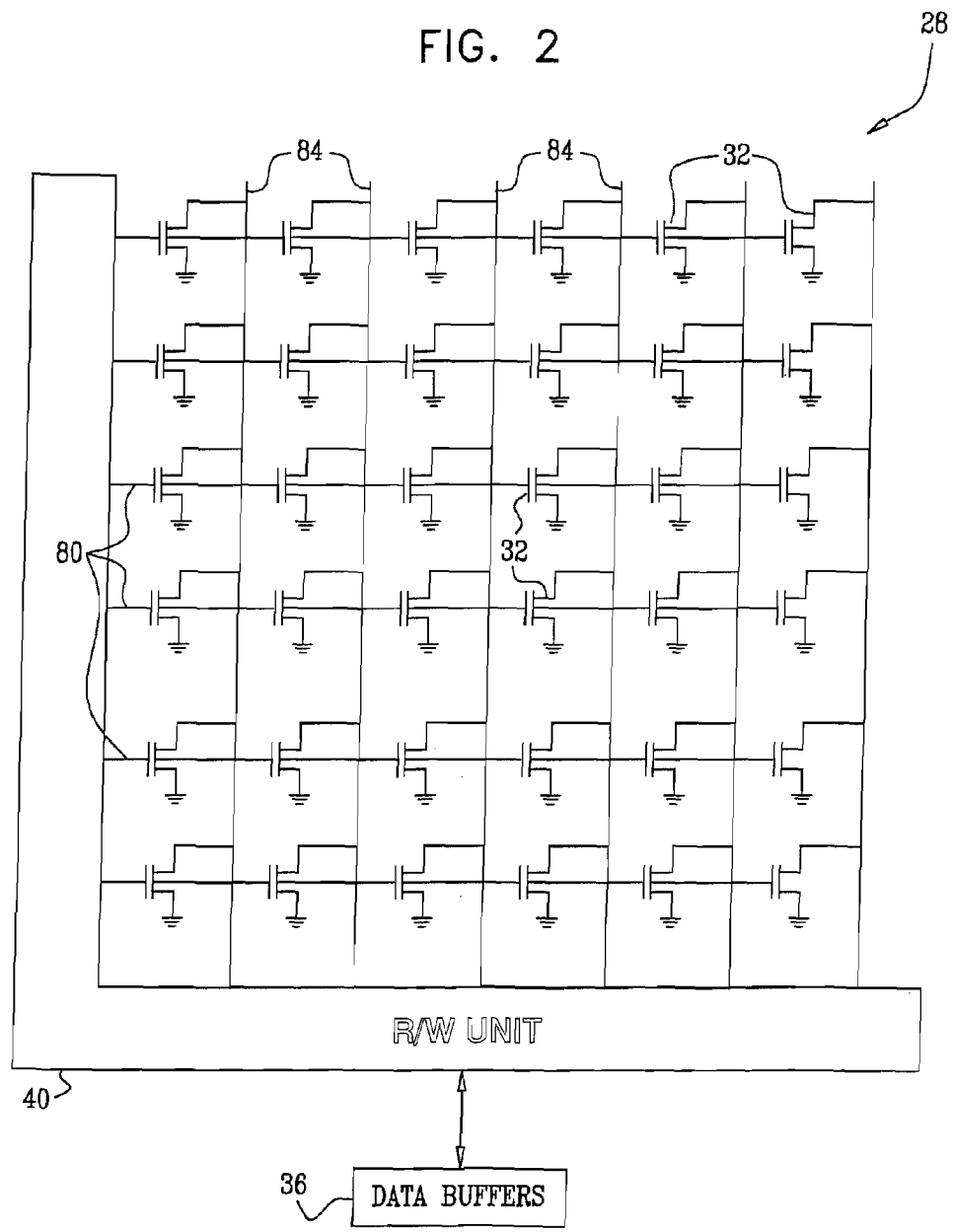
FIG. 2 is a diagram that schematically illustrates a memory cell array, in accordance with an embodiment of the present invention.

FIG. 2 is a diagram that schematically illustrates memory cell array 28, in accordance with an embodiment of the present invention. Although FIG. 2 refers to Flash memory cells that are connected in a particular array configuration, the principles of the present invention are applicable to other types of memory cells and other array configurations, as well. Some exemplary cell types and array configurations are described in the references cited in the Background section above.

Memory cells 32 of array 28 are arranged in a grid having multiple rows and columns. Each cell 32 comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is indicative of the charge stored in the cell.

In the exemplary configuration of FIG. 2, the gates of the transistors in each row are connected by word lines 80. The sources of the transistors in each column are connected by bit lines 84. In some embodiments, such as in some NOR cell devices, the sources are connected to the bit lines directly. In alternative embodiments, such as in some NAND cell devices, the bit lines are connected to strings of floating-gate cells.

Typically, R/W unit 40 reads the threshold voltage of a particular cell 32 by applying varying voltage levels to its gate (i.e., to the word line to which the cell is connected) and checking whether the drain current of the cell exceeds a certain threshold (i.e., whether the transistor conducts). Unit 40 usually applies a sequence of different voltage values to the word line to which the cell is connected, and determines the lowest gate voltage value for which the drain current exceeds the threshold. Typically, unit 40 reads a group of cells, referred to as a page, simultaneously. Alternatively, R/W unit may use any other technique or circuitry for reading and writing values to and from memory cells 32 of array 28.

The memory cell array is typically divided into multiple pages, i.e., groups of memory cells that are programmed and read simultaneously. In some embodiments, each page comprises an entire row of the array. In alternative embodiments, each row (word line) can be divided into two or more pages. For example, in some SLC devices each row is divided into two pages, one comprising the odd-order cells and the other comprising the even-order cells. Typically but not necessarily, a two-bit-per-cell memory device usually has four pages per row, a three-bit-per-cell memory device has six pages per row, and a four-bit-per-cell memory device has eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line is often partitioned into four pages (odd/even order cells, least/most significant bit of the cells). Alternatively, other block sizes and configurations can also be used. Three-bit-per cell devices often have 192 pages per erasure block, and four-bit-per-cell devices often have 256 pages per block.

Some memory devices comprise two or more separate memory cell arrays, often referred to as planes. Since each plane has a certain "busy" period between successive write operations, data can be written alternately to the different planes in order to increase programming speed.

Memory Cell Distortion Mechanisms

The analog values (e.g., threshold voltages) stored in memory cells 32 may contain various types of distortion, which are caused by different distortion mechanisms in array 28. For example, electrical cross-coupling between nearby cells in the array may modify the threshold voltage of a particular cell. As another example, electrical charge may leak from the cells over time. As a result of this aging effect, the threshold voltage of the cells may drift over time from the initially-written value. Another type of distortion, commonly referred to as disturb noise, is caused by memory access operations (e.g., read, write or erase operations) on certain cells in the array, which cause unintended charge variations in other cells. As yet another example, the source-drain current of a particular cell can be affected by the charge in adjacent cells, e.g., other cells in the same NAND cell string, via an effect referred to as Back Pattern Dependency (BPD).

The distortion in memory cells 32 degrades the performance of the memory device, e.g., the error probability when reconstructing the data, the achievable storage capacity and/or the achievable data retention period. Performance degradation is particularly severe in MLC devices, in which the differences between the different voltage levels that represent the data are relatively small.

Reading Memory Cells Using Multiple Thresholds

Embodiments of the present invention provide improved methods and systems for reading data from analog memory cells 32 of array 28, by using multiple read thresholds. The methods described herein are suitable for both SLC devices (as illustrated, for example, in FIG. 3 below) and MLC devices (as illustrated, for example, in FIG. 4 below).

Figure 3:
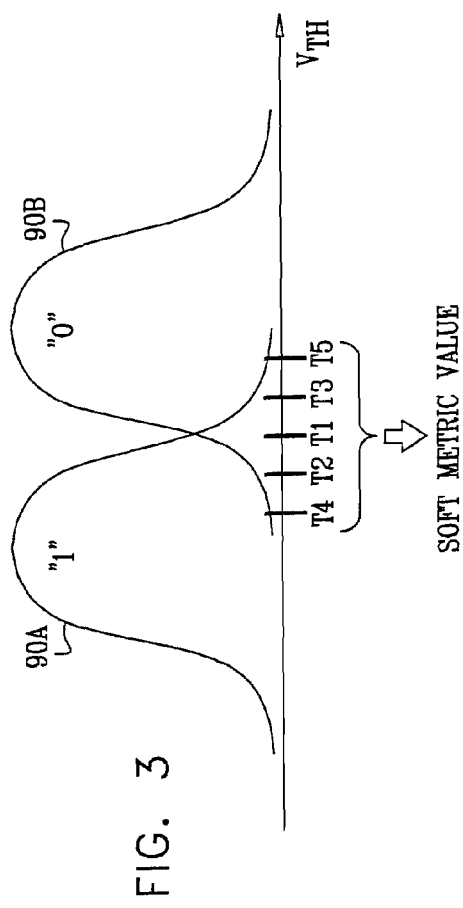
FIG. 3 is a diagram that schematically illustrates read thresholds in a Single-Level Cell (SLC), in accordance with an embodiment of the present invention.

FIG. 3 is a diagram that schematically illustrates read thresholds in an SLC device, in accordance with an embodiment of the present invention. The figure shows two statistical distributions of the threshold voltages in a group (e.g., page) of analog memory cells. For a specific page, the diagram represents a histogram of the threshold voltages stored in the memory cells of the page. In the example of FIG. 3, each memory cell is programmed to one of two possible nominal levels, i.e., each cell stores a single data bit. Due to various distortion variations among the cells and various impairment mechanisms, the actual threshold voltages read from the memory cells may statistically vary from the nominal levels. In the present example, a curve 90A shows the distribution of threshold voltages of the cells, which are programmed to store a "1" value. A curve 90B shows the distribution of threshold voltages of the cells that are programmed to store "0".

As can be seen in the figure, curves 90A and 90B overlap. In other words, there is a finite probability that a memory cell, which was programmed to a certain bit value, will be erroneously interpreted as being programmed to another bit value. The position of the read threshold or thresholds used to differentiate between "1" and "0" has a considerable effect on the probability of error. In some embodiments of the present invention, MSP 52 reconstructs the data stored in the memory cells by combining information, which is obtained using multiple read thresholds, in order to reduce the probability of error.

FIG. 3 shows five thresholds denoted T1 . . . T5. In some embodiments, MSP 52 reads each memory cell using each of the thresholds. Each read operation produces a comparison result, i.e., an indication of whether the read threshold voltage is greater or smaller than the threshold used in the operation. In the exemplary embodiment of FIG. 3, the MSP reads each memory cell five times, using thresholds T1 . . . T5, to produce five respective comparison results. The MSP may go through the different thresholds at any suitable order. For example, the MSP may begin with the threshold positioned in the middle of the desired region and gradually move away from this point by adding thresholds on either side of the initial threshold. Exemplary iterative methods that gradually increase the number of thresholds are described further below.

For each memory cell being read, the MSP computes a soft metric using the multiple comparison results. The soft metric indicates a confidence level or measure of certainty associated with the value read from the memory cell. In some embodiments, the soft metric indicates a likelihood that the read value corresponds to a certain data value (e.g., a very low metric value may indicate a high certainty that the read value corresponds to a "1", a very high metric value indicates that the read value is likely to represent a "0", and intermediate metric values indicate lower confidence). In other embodiments, the metric value indicates the reliability of the read value without indicating a particular bit value (e.g., low metric value indicates low confidence, high metric value represents high confidence).

In the context of the present patent application and in the claims, the term "soft metric" refers to any type of quantitative measure that conveys more than a single bit of information, i.e., more than two possible values. For example, the soft metric may comprise a fixed- or floating-point numerical value represented using two or more bits. Another exemplary type of soft metric, sometimes referred to as "erasure," assigns each read memory cell one of three possible values— "0", "1" or "uncertain." Further alternatively, any other suitable type of soft metric can be used.

Note that when each cell stores multiple data bits, a soft metric value may be computed and assigned to each individual bit. For example, in a four-level MLC, one metric value is computed for the Least Significant Bit (LSB) and another metric value is computed for the Most Significant Bit (MSB). Detailed examples of metric computation methods for both SLC and MLC applications are described further below.

MSP 52 may use any suitable method for computing the soft metric value based on the multiple comparison results. In some embodiments, the MSP may use a table, which provides the metric values associated with different combinations of the comparison results. For example, the following table can be used with the five-threshold configuration of FIG. 3:

| Comparison results | | | | | Metric |
| --- | --- | --- | --- | --- | --- |
| T1 | T2 | T3 | T4 | T5 | value |
| 0 | 0 | 0 | 0 | 0 | M1 |
| 0 | 0 | 0 | 0 | 1 | M2 |
| 0 | 0 | 0 | 1 | 0 | M3 |
| 0 | 0 | 0 | 1 | 1 | M4 |
| ... | ... | ... | ... | ... | ... |
| 1 | 1 | 1 | 1 | 0 | M31 |
| 1 | 1 | 1 | 1 | 1 | M32 |

The table above provides thirty-two soft metric values denoted M1 ... M32, which correspond to the thirty-two possible combinations of five comparison results of thresholds T1 ... T5. Following the notation of FIG. 3, a "0" comparison result means that the read value was higher than the threshold used, and a "1" comparison result means the read value was lower than the threshold.

Typically, M1 and M32 will indicate high confidence levels, since these metric values correspond to situations in which the read operations with all five thresholds produce the same comparison results. Other combinations of comparison results will usually be assigned metrics that indicate lower confidence levels.

Some sets of comparison results may be regarded as inconsistent or self-contradictory. For example, assume T1<T2<T3<T4<T5, and that the five comparison results produced by thresholds T1 ... T5 are denoted C1 ... C5, respectively. The result set '1,1,1,0,1' for a certain memory cell is inconsistent because it indicates that the analog value is larger than T4 and smaller than T3, even though T4>T3. Such a result set may be caused, for example, when the cell has a high level of read noise in at least one of the read operations. Result sets such as '1,1,1,1,0', '1,1,1,0,0', or '1,0,0,0,0', on the other hand, are consistent.

The MSP may treat inconsistent sets of comparison results in different manners, by assigning them different soft metric values. For example, the MSP may regard inconsistent result sets as uncertain and mark them as erasures to the ECC decoding process. Alternatively, the MSP may disregard or otherwise attempt to resolve some inconsistencies. For example, the MSP may regard a '1,1,0,1,1,' result set similarly to a '1,1,1,1,1' set, assuming that the "0" comparison result of T3 was caused by read noise.

Alternatively to using tables, MSP 52 may evaluate a function that operates on the multiple comparison results and produces the corresponding soft metric value. For example, the MSP may evaluate Log Likelihood Ratios (LLRs) of individual bits in each memory cell, which are defined as $$LLR \equiv \Lambda(X_i) = \log\left[\frac{p(X_i = 1 | r)}{p(X_i = 0 | r)}\right] \quad [1]$$

wherein $X_i$ denotes a particular data bit stored in the memory cell in question, and r denotes the analog value read from the cell. The use of LLRs as metrics that are provided to an ECC decoding process is described, for example, in PCT Patent Application PCT/IL2007/000580, entitled "Combined Distortion Estimation and Error Correction Coding For Memory Devices," filed May 10, 2007, whose disclosure is incorporated herein by reference.

In order to calculate the LLR, the MSP may maintain two values for each memory cell: (1) the largest read threshold that was found to be below the analog value of the cell, denoted $V_a$, and (2) the smallest read threshold that was found to be above the analog value of the cell, denoted $V_b$. The LLR of the cell can be shown to be approximated by $$\Lambda(X_i) \approx \log\left[Q\left\{\frac{V_a - T_1}{\sigma}\right\} - Q\left\{\frac{V_b - T_1}{\sigma}\right\}\right] - \log\left[Q\left\{\frac{V_a - T_0}{\sigma}\right\} - Q\left\{\frac{V_b - T_0}{\sigma}\right\}\right] \quad [2]$$

wherein T1 denotes the center analog value of the nearest distribution that has "1" as its data bit, and T0 denotes the center value of the nearest distribution having "0" as its data bit. The distribution of r is assumed Gaussian with variance $\sigma^2$.

As the memory cell is read with an increasing number of read thresholds, the MSP updates $V_a$ and $V_b$. At each stage, the actual analog value of the cell is known to be within the interval $[V_a, V_b]$. As the number of thresholds increases, the interval shrinks, the uncertainty becomes smaller and the estimated LLR becomes more accurate.

Further alternatively, the MSP may use any other suitable method or mechanism for computing the soft metric values based on the multiple comparison results.

MSP 52 uses the soft metrics when decoding the ECC. In a typical application, the data stored in a group of memory cells, such as in a certain memory page, forms a single codeword. When decoding a certain ECC codeword, signal processing unit 60 of the MSP uses the soft metric values of the memory cells in the group. As a result, memory cells that are considered to have a high confidence level are given more weight in the ECC decoding process, and vice versa.

Figure 4:
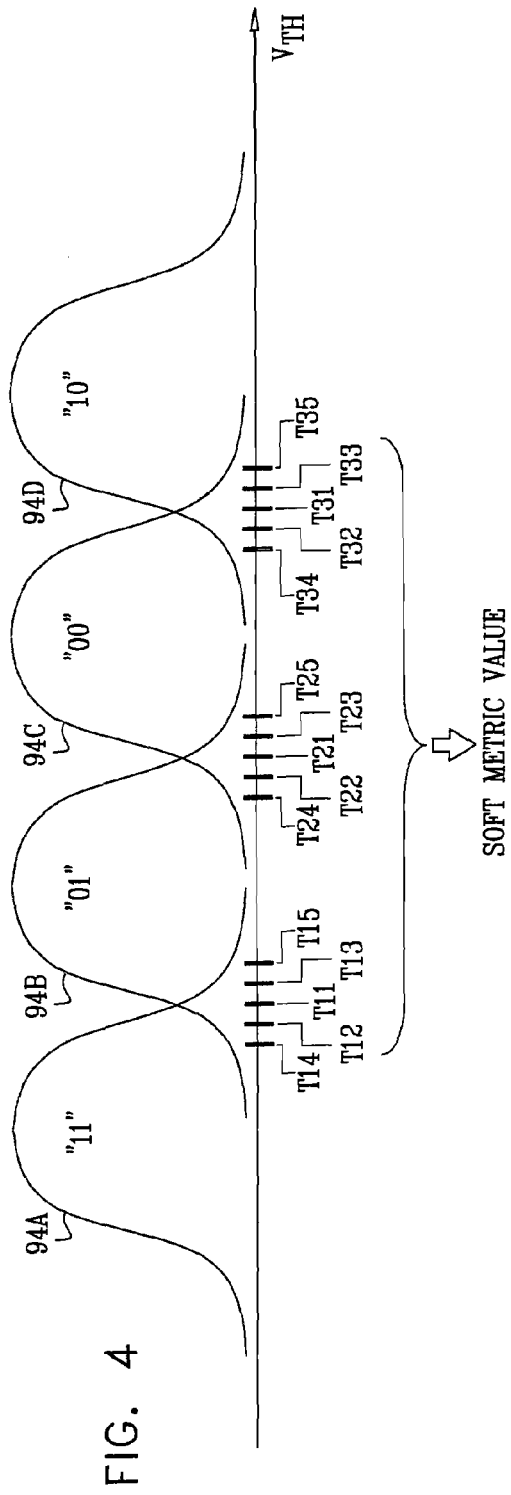
FIG. 4 is a diagram that schematically illustrates read thresholds in a Multi-Level Cell (MLC), in accordance with an embodiment of the present invention.

FIG. 4 is a diagram that schematically illustrates read thresholds in an MLC device, in accordance with an embodiment of the present invention. In the example of FIG. 4, each memory cell is programmed to one of four possible nominal levels, thus storing two bits of data. Curves 94A . . . 94D show the threshold voltage distributions of the memory cells that are programmed to store "11", "01", "00" and "10" data, respectively. In the present example, MSP 52 reads the memory cells using five sets of thresholds. Each threshold set comprises three thresholds, which are typically positioned in the three boundary regions between pairs of adjacent distribution curves. The threshold sets are listed in the following table:

| Threshold set | Thresholds |
|---|---|
| 1 | T11, T21, T31 |
| 2 | T12, T22, T32 |
| 3 | T13, T23, T33 |
| 4 | T14, T24, T34 |
| 5 | T15, T25, T35 |

In some embodiments, MSP 52 reads the threshold voltage of the cell using each of the fifteen thresholds, and computes a soft metric based on the fifteen comparison results. The MSP may use any type of soft metric and any method of computing the metric value based on the multiple comparison results. The MSP uses the soft metric values as input to the ECC decoding process, as explained above.

In alternative embodiments, the memory cell is read in two stages, corresponding to the two bits stored in the cell. For example, in the configuration of FIG. 4, the R/W unit performs a first set of comparisons using the five thresholds T21, T22, T23, T24 and T25, i.e., the thresholds located in the middle of the voltage axis, between curves 94B and 94C. The MSP computes a first soft metric based on the five comparison results obtained using these five thresholds. Note that both nominal levels located above thresholds T21 . . . T25 have an LSB value of "0" and that both nominal levels located below thresholds T21 . . . T25 have an LSB value of "1". Therefore, the first soft metric corresponds to the LSB. Once the LSB is decoded, the R/W unit performs a second set of comparisons. The R/W unit may use thresholds T11 . . . T15 or thresholds T31 . . . T35 in the second stage, depending on the decoded value of the LSB. If the LSB was determined to be "1", i.e., the read value was determined to be in the lower part of the voltage range, the MSB will be decoded using thresholds T11 . . . T15 in the second stage. If the LSB was decoded as "0", the MSB will be decoded using thresholds T31 . . . T35. The MSP computes a second metric, which corresponds to the MSB, based on the five comparison results obtained in the second comparison stage.

A similar multi-stage comparison process can be carried out in multi-level cells storing a higher number of bits. For example, in eight-level (3 bit/cell) cells, the MSP and R/W unit may perform a three-stage comparison process to decode the individual bits. Apart from the first stage, the selection of the thresholds used in each stage typically depends on the decoded values of the previous bits.

In alternative multi-stage reading processes, each bit is read independently of the other bits. For example, referring to FIG. 4, the LSB can be read using thresholds T21 . . . T25. The MSB is read by sequentially reading the cell using both thresholds T11 . . . T15 and T31 . . . T35. If the comparison results indicate that the analog value is between T11 . . . T15 and T31 . . . T35, the bit is determined to be "0". If, on the other hand, the comparison results indicate that the analog value is larger than T31 . . . T35 or smaller than T11 . . . T15, the bit is determined to be "1". In this example, the comparison results to thresholds T21 . . . T25, which were used for reading the LSB, are not used for reading the MSB. Similar processes may be performed for other types of MLC, such as eight-level cells storing three bits per cell.

The threshold configurations shown in FIGS. 3 and 4 above are exemplary configurations, which were chosen purely for the sake of conceptual clarity. In alternative embodiments, system 20 may use any desired number of nominal levels, any other mapping of bit values to nominal levels and any desired number of threshold sets. Although FIGS. 3 and 4 show thresholds that are spaced at regular increments, the methods and systems described herein may use irregularly-spaced thresholds, as well. In MLC devices, the threshold spacing may vary from one voltage region to another. For example, in FIG. 4, thresholds T11 . . . T15 may be spaced differently than thresholds T21 . . . T25. Different threshold spacing may be used, for example, when different analog value distributions have different shapes or different spacing with respect to one another. The MSP may modify the threshold spacing, or otherwise select the threshold values to use, such as based on estimation of the analog value distributions.

FIG. 5 is a flow chart that schematically illustrates a method for reading data from analog memory cells 32, in accordance with an embodiment of the present invention. For a certain memory cell, the method begins with system 20 performing multiple read operations using respective multiple thresholds, at a reading step 100. The multiple read operations produce respective multiple comparison results, i.e., indications of whether the threshold voltage of the cell is smaller or greater than the different thresholds. MSP 52 computes a soft metric of the memory cell based on the multiple comparison results, at a metric computation step 104.

The MSP typically repeats the process of steps 100 and 104 above over a group of memory cells, whose data forms a single ECC codeword. In a typical implementation, R/W unit 40 reads the cells of an entire page of the memory device, using a particular threshold value, simultaneously. Once the soft metrics of the cells that store a certain codeword are computed, the MSP decodes the codeword using the metrics, at a decoding step 108. The MSP extracts the decoded data, at a data extraction step 112. The decoded data is typically output to the host system.

The multiple-threshold reading methods described herein can also be viewed as an efficient means for obtaining accurate information regarding the stored analog values using a relatively small number of read operations. Theoretically, if the exact analog values stored in the memory cells were known to the MSP (e.g., by employing high-resolution analog-to-digital conversion), this information could be used to extract probability measures on the stored data. However, the basic read operation of analog memory devices, such as Flash memories, usually comprises comparison operations, which compare the analog value stored in a cell to a single threshold.

In order to obtain the analog value with a given resolution, the entire possible voltage range would have to be searched or scanned with the desired resolution. For example, if the range of possible analog values is 0-4V, and the desired resolution is 10 mV, 400 read operations would be needed. In practice, however, much of the valuable statistical information can be obtained by performing a much smaller number of read operations, for example by positioning the read thresholds in a region around the midpoint between distributions. The methods and systems described herein thus provide efficient means of gaining insight to such analog value statistics using a relatively small number of read operations.

In many practical cases, performing a large number of read operations on a certain memory cell is a computationally-intensive task, which complicates and slows down the data retrieval process. Moreover, the ECC is usually strong enough to successfully decode the vast majority of codewords, even when the memory cells are read using a single set of thresholds. Therefore, in some embodiments, the MSP initially reads the memory cells using a single set of thresholds. The MSP reverts to read the memory cells that correspond to a certain codeword using the multiple-threshold methods described herein only when the ECC decoding process fails.

The methods of FIGS. 3-5 above can be applied iteratively, gradually increasing the number of thresholds used. For example, the MSP may attempt to reconstruct the data using soft metrics that are based on two sets of thresholds. If the data cannot be reconstructed (i.e., if the ECC fails), the MSP can re-read the memory cells using a third threshold set. The iterations may continue until ECC decoding succeeds, or until reaching a predetermined maximum number of threshold sets. Note that at each stage of the iterative process, the MSP computes the soft metrics based on the multiple comparison results that are available so far. In some cases, the MSP may use information, such as metric values, which was calculated in previous iterations. The iterative process enables a gradual increase in the number of computations, only as needed to carry out successful decoding.

Soft Metrics Based on Counting Computation Results

In some embodiments, the MSP computes the soft metric value based on the number of computation results falling on either side of the thresholds. (In the description that follows, a "0" comparison result means the read value was higher than the threshold, and vice versa. This convention, however, is chosen purely for the sake of convenience, and the opposite convention can also be used.) Consider, for example, the exemplary SLC embodiment of FIG. 3 above. In this embodiment, out of the five comparison results, if the number of "0" comparison results is considerably higher than the number of "1" results, it is likely that the cell was programmed to "0". Similarly, if the number of "1" comparison results is considerably higher than the number of "0" results, the programmed bit is likely to be "1". Similar logic can also be used within each stage of the multi-stage comparison process that decodes the individual bits of a MLC cell, which was described in FIG. 4 above.

FIG. 6 is a flow chart that schematically illustrates an exemplary method for computing soft metrics, in accordance with an embodiment of the present invention. The method description refers to an SLC application and makes reference to FIG. 3 above. This choice, however, is made purely for the sake of simplicity of explanation. The method can similarly be used in MLC applications, as well.

The method begins with the MSP defining multiple thresholds, at a threshold definition step 116. Typically but not necessarily, the thresholds are defined within the boundary region between the voltage distribution. In FIG. 3, five thresholds are defined in the region in which curves 90A and 90B overlap. For example, assuming the mid-point between curves 90A and 90B is at 1 volt, and that the thresholds can be represented at a resolution of 20 mV, a set of thresholds can be defined to cover the voltage range of 1V±40 mV at 20 mV intervals.

The MSP reads the memory cells using the multiple thresholds, at a reading step 120. The MSP counts the number of comparison results falling on either side of the thresholds, at a counting step 124. In other words, the MSP determines the number of "0" comparison results and/or the number of "1" results out of the total number of threshold comparisons.

The MSP computes a soft metric associated with the cell (or with an individual bit within the cell) based on the count of comparison results, at a metric computation step 128. For example, assuming the five-threshold configuration of FIG. 3 above and a four-bit metric value, the MSP may compute the soft metric according to the following table:

| Number of "0" computation results | Number of "1" computation results | Soft metric value |
|---|---|---|
| 0 | 5 | "1111" = 15 |
| 1 | 4 | "1100" = 12 |
| 2 | 3 | "1001" = 9 |
| 3 | 2 | "0110" = 6 |
| 4 | 1 | "0011" = 3 |
| 5 | 0 | "0000" = 0 |

In the table above, if all five computation results are "1", the stored data bit is "1" with high likelihood, therefore the maximum metric value of "1111" is assigned. At the other extreme, if all five comparison results are "0", the stored bit is likely to be "0", and the minimum metric value of "0000" is assigned. If some comparison results are "0" and others are "1", the metric value is set to an intermediate value, which grows monotonously with the number of "1" results out of the total.

Alternatively, any other suitable method for determining the soft metric value based on the count of comparison results can be used. The metric computation may be implemented by querying a table that holds the metric values and is indexed by the count of comparison results, evaluating a function that operates on the count of the comparison results, or using any other suitable mechanism.

Exemplary Hardware Implementation for MLC Metric Computation

As noted above, when computing the soft metrics of individual bits in a multi-level cell, the selection of thresholds may depend on the values of previously-decoded bits. Moreover, the values of previously-decoded bits may in some cases affect the metric value itself.

Consider, for example, the four-level cell configuration of FIG. 4 above. When reading the data out of such a cell in a two-stage process, the LSB is first decoded by determining whether the value read from the cell falls on the left- or right-hand-side of thresholds T21 . . . T25. Note that in the example of FIG. 4, the two nominal levels located below these thresholds have an LSB value of "1", and the two nominal levels located above the thresholds have an LSB value of "0".

The second decoding stage (decoding of the MSB) depends on the results of the first stage. When the LSB is "0", decoding the MSB comprises determining whether the read value is likely to belong to curve 94C or to curve 94D. When the LSB is "1", decoding the MSB comprises determining whether the read value is likely to belong to curve 94A or to curve 94B.

Note, however, that when comparing curves 94A and 94B (i.e., when LSB="1"), high threshold voltages correspond to MSB="0" and low threshold voltages correspond to MSB="1". When comparing curves 94C and 94D (i.e., when LSB="0") the situation is reversed, with high threshold voltages corresponding to MSB="1" MSB and low threshold voltages corresponding to MSB="0". In such a situation, the soft metric value that depends on the count of comparison results should sometimes be inverted, so as to maintain the convention that a high metric value corresponds to "0" data. The decision whether or not to invert the metric value depends on the value of the previous bit. Equivalently, the value of the currently-read bit can be inverted instead of inverting the metric value. The conditional operation of inverting a value only if a previous value is equal to "1" can be implemented by performing an eXclusive-OR (XOR) operation between the current and previous bit values.

Figure 7:
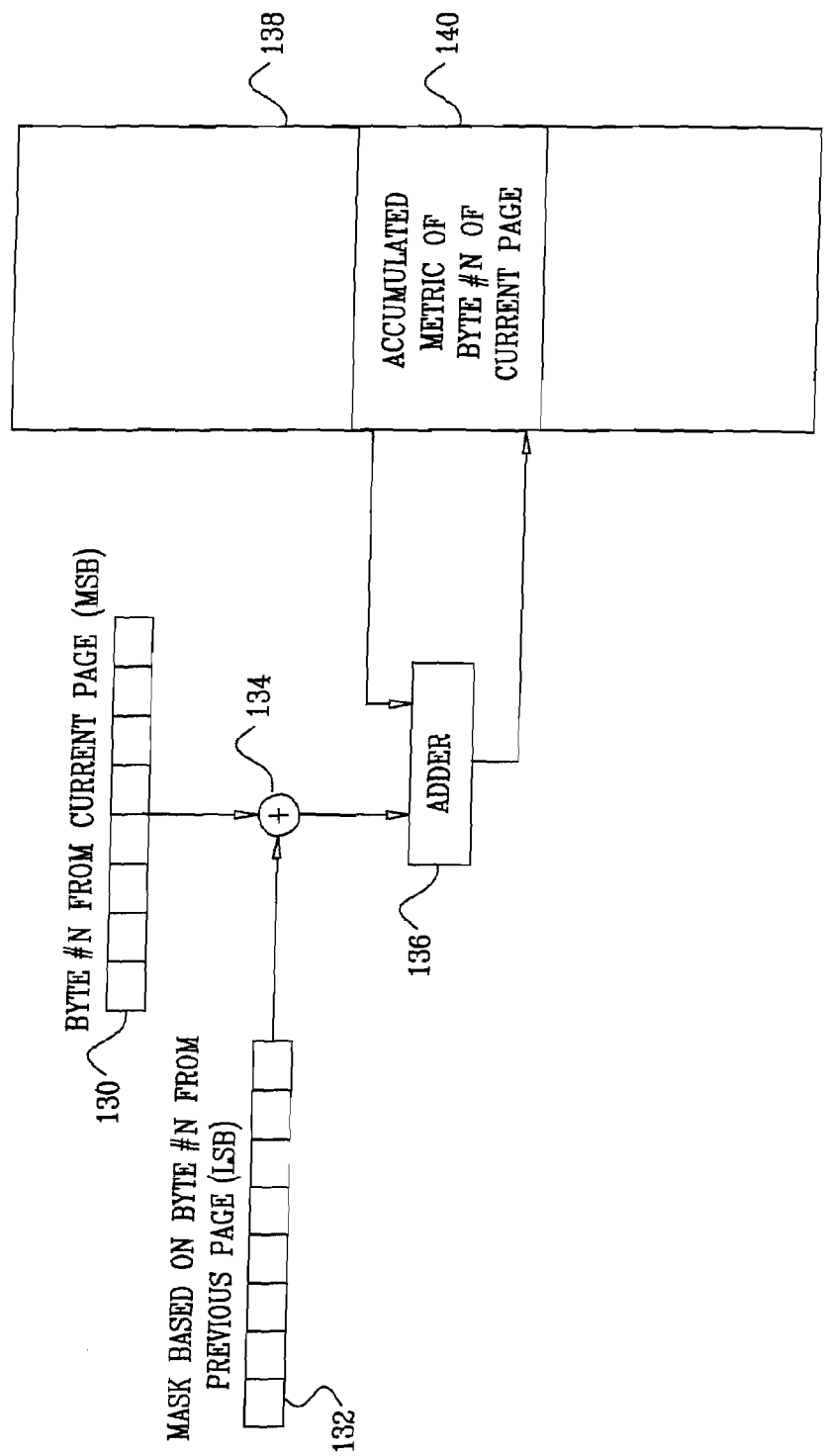
FIG. 7 is a block diagram that schematically illustrates a circuit for computing soft metrics, in accordance with an embodiment of the present invention.

FIG. 7 is a block diagram that schematically illustrates an exemplary circuit for computing soft metrics in a multi-level cell, in accordance with an embodiment of the present invention. Although the description that follows refers to a hardware or firmware implementation, a similar mechanism can be implemented in software, or as a combination of software and hardware elements.

The circuit of FIG. 7 computes soft metrics of the LSBs and MSBs of a group of four-level cells, assuming the LSBs represent a certain memory page and the MSBs represent another page. The LSB page is read first and is referred to as the previous page. The MSB page is read second and is referred to as the current page. The computation process of the metrics of the current page makes conditional inversion (XOR) operations depending on the bit values of the previous page.

The circuit comprises a XOR circuit 134, which performs a bit-wise XOR operation between a byte 130 of hard bit decisions from the current page (MSBs) and a byte 132 of previously-decoded data bits (LSBs) from the previous page. Thus, for a particular cell, when the previously-decoded LSB is "1", the currently-read MSB is inverted. An adder 136 sums the results of the XOR operations. The adder output is accumulated as a soft metric 140 of the MSB. A vector 138 holds the accumulated metrics of the MSBs of the different cells. The same circuit can also be used to compute the soft metrics of the LSBs, which do not depend on any previous values. In order to compute the LSB soft metrics, byte 132 is filled with zeros so that the XOR operation is bypassed and byte 130 is provided to adder 136 unchanged.

The circuit of FIG. 7 refers to four-level, 2 bit/cell MLC. Similar circuits can be used, however, to compute soft metrics for other types of multi-level cells, such as eight-level, 3 bits/cell MLC.

In alternative embodiments, the soft metrics of individual bits of a multi-level cell can be calculated independently for different bits. These methods may be of particular benefit when the read data values of previous bits are not available when reading a certain bit. Referring to the 2 bit/cell example of FIG. 4 above, the soft metrics of the MSB may be computed without knowledge of the LSB. As noted above, the MSB value can be assumed to be "0" if the analog value falls between thresholds T11 . . . T15 and T31 . . . T35, and "1" otherwise. In order to compute a soft metric for such a reading process, the MSP may group the thresholds in pairs that move progressively inwards into the region in which MSB="0". The MSP counts the comparison results falling inside and/or outside the MSR="0" interval using the different threshold pairs.

In the present example, the MSP forms the pairs (T14, T35), (T12, T33), (T11, T31), (T13, T32) and (T15, T34). For each pair, the MSP performs two read operations and checks whether the read value falls in the interval between the thresholds, or outside the interval. The MSP counts the number of threshold pairs in which the analog value falls between the two thresholds (indicating MSB="0") and/or the number of threshold pairs in which the analog value falls outside the interval between the two thresholds (indicating MSB="1"). The MSP computes a soft metric based on the counts.

A similar method can be applied to eight-level, 3 bit/cell MLC. Assume, for example, an eight-level MLC device whose eight levels are denoted L1 . . . L8 and are mapped to the bit triplets '111', '011', '001', '101', '100', '000', '010', '110', respectively. The MSP can compute the soft metric of the MSB (leftmost bit in the triplet) of such a cell independently of the other bits by performing comparisons using four sets of multiple thresholds. Each threshold set is positioned between adjacent levels having different MSB values. In the present example, one set is positioned between levels L1 and L2, another set between L3 and L4, a third set between L5 and L6 and a fourth set between L7 and L8. The four threshold sets divide the analog value axis into five intervals denoted I1 . . . I5, such that the MSB has the same value within each interval.

Using this division, the MSP determines that the MSB is "0" if the read analog value read from the cell falls within interval I2 or I4, and "1" if the analog value falls within interval I1, I3 or I5. In order to compute the soft metric of the MSB, the MSP forms groups of four thresholds, with each group containing one threshold from each set. Moving from group to group, each threshold is moved in the direction in which the MSB value transition is from "1" to "0". For each threshold group, the MSP performs four read operations and checks whether the read value falls in intervals corresponding to "1" or in intervals corresponding to "0". The MSP counts the number of threshold groups in which the analog value falls in intervals that correspond to MSB="0" and/or the number of groups in which the analog value falls in intervals that correspond to MSB="1". The MSP computes a soft metric based on the counts.

Typically but not necessarily, soft metrics that are based on counting comparison results of a given type assume that the read thresholds are positioned symmetrically around the midpoint between distributions.

Gradually Increasing the Number of Thresholds

The comparison and metric computation operations described above consume both time and computation resources, which grow with the number of thresholds. Therefore, it is sometimes advantageous to use only as many thresholds as needed to successfully reconstruct the data. In some embodiments, the MSP initially attempts to compute the soft metrics and decode the data with a relatively small number of thresholds, and increase their number only when needed.

For example, the MSP may make an initial attempt to decode the ECC using an initial set of read thresholds in which only a single threshold is positioned between each pair of adjacent nominal values (memory states). In these embodiments, the MSP reverts to multiple-threshold decoding upon failure of the initial decoding attempt.

FIG. 8 is a flow chart that schematically illustrates an exemplary method for reading data from analog memory cells by gradually increasing the number of thresholds, in accordance with another embodiment of the present invention. Initially, it is assumed that the MSP attempted to decode a particular codeword stored in a group of memory cells using soft metrics that were obtained using a certain number of thresholds, and that ECC decoding has failed. The metrics are assumed to be based on the count of comparison results, as explained above.

The method begins with the MSP adding one or more additional thresholds to the set of thresholds used, and reading the group of memory cells using the added thresholds, at a threshold addition step 142.

The MSP updates the count of comparison results (i.e., the number of "0" and/or "1" results out of the total), at a count updating step 144. The updated count reflects the comparison results of the previous thresholds as well as of the newly-added thresholds. The MSP then computes the soft metrics based on the updated accumulated count of comparison results, and a metric updating step 146.

In some cases, the MSP may compute the metrics from scratch at each iteration. Alternatively, the MSP may store the metric values and/or comparison result counts from previous iterations, and update them to account for the newly-added comparison results. Generally, the soft metric computed at a given iteration may depend on the current comparison result count, on previous counts and on previous metric values.

The MSP computes soft metrics based on the accumulated count of comparison results, at a metric computation step 146. Any suitable metric computation method can be used, such as the exemplary methods described above. The MSP attempts to decode the codeword using the soft metrics, at an ECC decoding step 148. The MSP checks whether the ECC decoding was successful, at an ECC checking step 150. If successful, the MSP extracts and outputs the data, at a data extraction step 152, and the method terminates.

If, on the other hand, ECC decoding fails, the method loops back to threshold addition step 142 above. The MSP adds one or more additional thresholds to the set of thresholds, computes soft metrics based on the extended set, and attempts to decode the ECC again.

The method of FIG. 8 enables the MSP to use only as many thresholds as needed to successfully decode the ECC. When distortion is not severe, most codewords can be decoded using a small number of thresholds, enabling a high overall or average reading speed.

Alternatively to continuing the iterations until successful decoding of the ECC, the MSP may evaluate any other suitable condition, and stop the iterative process when the condition is met. For example, the MSP may continue to add thresholds until reaching a maximum number of thresholds, or a maximum number of iterations.

In some embodiments, the ECC decoding process may comprise an iterative process. Iterative decoding processes are commonly used to decode codes such as LDPC and turbo codes. In these embodiments, the iterative decoding process is provided with increasingly-improving metrics, which are based on an increasing number of read thresholds. In other words, the iterative decoding process starts decoding using metrics, which are based on a certain initial number of thresholds. Subsequent iterations of the iterative decoding process are provided with metrics that are based on an increasing number of read thresholds, until the iterative decoding process converges to a valid codeword.

Additionally or alternatively to using an ECC in the method of FIG. 8, the MSP may use an error detection code, such as a Cyclic Redundancy Check (CRC) or checksum. In such embodiments, the MSP iteratively adds read thresholds until the error detection code detects no errors. Thus, in the context of the present patent application and in the claims, the term "ECC" is used to address various types of error detection codes, as well. In some embodiments, the MSP may use an error detection code to determine when to stop adding new thresholds, even though the data is encoded using an ECC. This scheme may be advantageous, for example, when the ECC does not provide a reliable indication of decoding success or failure.

The MSP may use various methods and criteria for selecting how many thresholds to add at each iteration, and in which order. For example, thresholds can be added two at a time, gradually moving away from the initial threshold position in both directions. In other words, assuming the MSP initially attempts to use a threshold denoted T and that the thresholds are spaced at regular intervals of $\Delta$, the threshold sets in the first four iterations are:

$\{T, T+\Delta, T-\Delta\}$
$\{T, T+\Delta, T-\Delta, T+2\Delta, T-2\Delta\}$
$\{T, T+\Delta, T-\Delta, T+2\Delta, T-2\Delta, T+3\Delta, T-3\Delta\}$
$\{T, T+\Delta, T-\Delta, T+2\Delta, T-2\Delta, T+3\Delta, T-3\Delta, T+4\Delta, T-4\Delta\}$ Metric Normalization and Interference Cancellation When computing soft metrics that depend on varying numbers of thresholds, such as in the method of FIG. 8 above, the possible range of metric values may vary with the number of thresholds used. For example, when the soft metric comprises the count of comparison results, the metric values based on three thresholds will be in the range [0 . . . 3], whereas metric values based on five thresholds will be in the range [0 . . . 5]. This effect is generally undesirable. In other words, it is generally desired to provide the ECC decoder with metrics, which use the same dynamic range for quantifying confidence or certainty, regardless of the number of threshold comparisons on which the metric is based.

In some embodiments, the MSP normalizes the soft values read from the memory cells based on the number of thresholds. For example, the MSP may apply bit extension to the values to reach a certain constant number of bits, e.g., five-bits. For example, the bit-extended value may be given by $$ExtendedValue = \begin{cases} 0 & Val = 0 \\ MaxVal & Val = N \\ Val + \dfrac{MaxVal - N}{2} & 0 < Val < N \end{cases} \quad [3]$$

wherein Val denotes the input soft value and N denotes the number of thresholds used to evaluate Val. Max Val denotes the maximum value of the bit-extended soft value, e.g., 31 for five-bit representation. Alternatively, the MSP may apply any other suitable data scaling mechanism.

In some embodiments, the MSP has information regarding the level of distortion or interference in the memory cells being read. Various methods can be used to estimate interference levels in memory cells. Exemplary methods are described in PCT Patent Application PCT/IL2007/000580, cited above and in PCT Patent Application PCT/IL2007/000576, entitled "Distortion Estimation and Cancellation in Memory Devices," filed May 10, 2007, and PCT Patent Application PCT/IL2007/001059, entitled "Estimation of Non-Linear Distortion in Memory Devices," filed Aug. 27, 2007, whose disclosures are incorporated herein by reference.

When an estimate of the interference is available to the MSP, the MSP may add the effect of the interference to the soft values, or otherwise modify the soft values based on the estimated interference, before these values are provided to the ECC decoder.

FIG. 9 is a diagram that schematically illustrates a process for reading data from analog memory cells, which involves data scaling and interference cancellation, in accordance with yet another embodiment of the present invention. Although the configuration of FIG. 9 is used to demonstrate both interference cancellation and scaling, each mechanism may be carried out with or without the other.

In the process of FIG. 9, a scaling module 154 accepts the conditionally-inverted soft values read from the memory cells (e.g., the outputs of XOR circuit 134 of FIG. 7 above). Module 154 also accepts an indication of the iteration number and/or the number of thresholds that are currently used. Module 154 applies bit extension or other scaling to the input soft values. The amount of scaling depends on the input iteration number.

The scaled soft values are provided to an interference cancellation module 156, which also accepts estimates of the interference level in the respective memory cells. Module 156 subtracts or otherwise cancels out the interference estimates from the corresponding soft values, to produce soft values that are properly scaled and contain reduced levels of interference. The soft values are provided to a metric computation module 158, which computes the soft metrics and provides them to the ECC decoder.

Trading-Off Threshold Comparisons and Interference Estimation

Re-reading cells with additional thresholds and estimating the interference from neighboring memory cells are two operations that on one hand improve the reading performance, and on the other hand consume time and computational power. In some embodiments, the MSP may combine the two operations and trade-off one operation for another. For example, the MSP may determine at each iteration whether it is preferable to refine the decoding accuracy by re-reading the current page using an additional threshold, or to refine the interference estimation by reading (or re-reading) a group of interfering cells.

Figure 10:
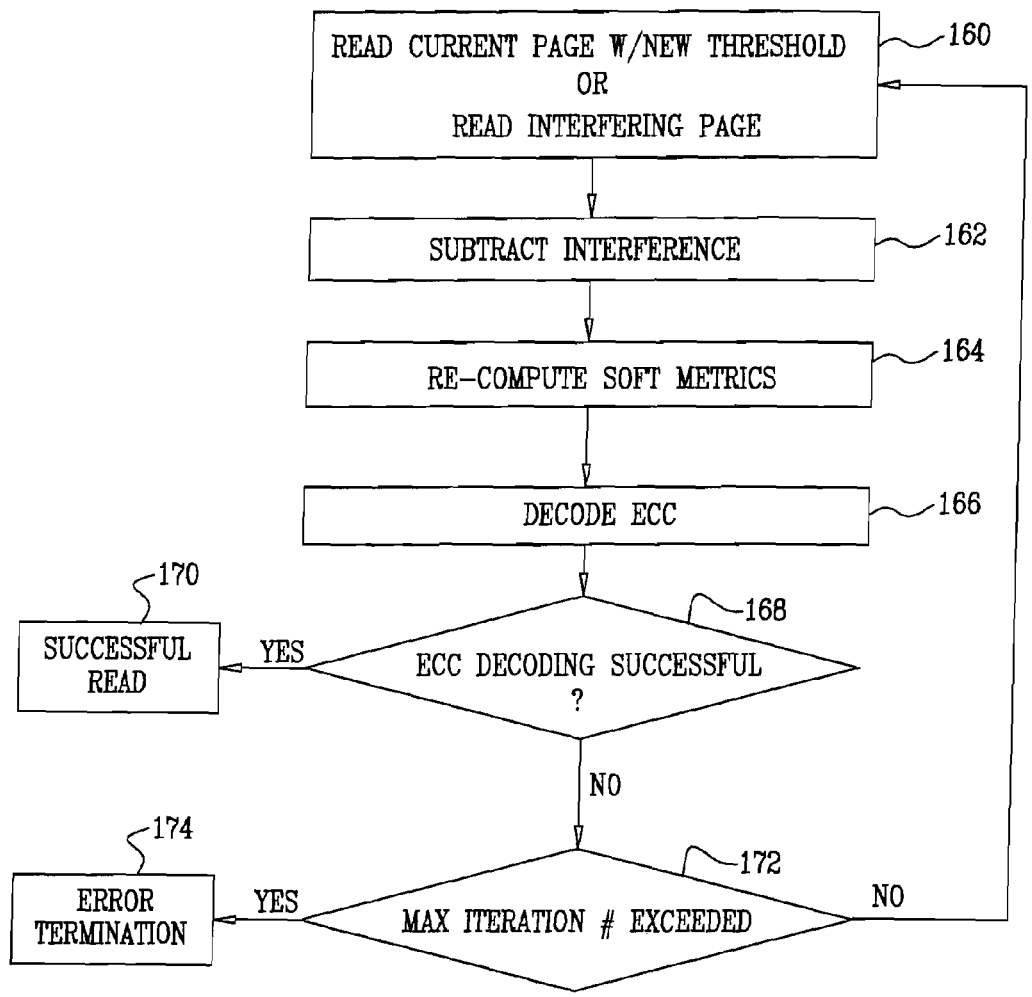
FIG. 10 is a flow chart that schematically illustrates a method for reading data from analog memory cells, in accordance with still another embodiment of the present invention.

FIG. 10 is a flow chart that schematically illustrates a method for reading data from analog memory cells that involves trading-off re-reading and interference estimation, in accordance with another embodiment of the present invention.

The method begins with the MSP reading a page of memory cells, at a reading step 160. At each cycle of the process, the MSP may select to either (1) re-read the desired page using an additional threshold, or (2) read a page of interfering cells. The MSP may apply various policies or heuristics in determining which of the two actions to take at each cycle. The MSP may read different groups of interfering cells at different cycles.

For example, the MSP may alternate between the two operations, thus adding a threshold every two cycles and estimating interference every two cycles. Alternatively, the MSP may choose which action to take based on the estimated level of the distortion. For example, if recent interference estimations indicate that the level of interference is low, the MSP may give precedence to adding threshold comparisons, and refine the interference estimation at larger intervals. Further alternatively, the decision may depend on the type of page being read. For example, even- and odd-order pages may experience different interference levels, and the MSP may apply different decision logic for different page types. Pages located on the last word line in a block may also experience different interference levels and may be treated differently. Since the interference may depend on the order in which the pages were written, different trade-offs may apply to higher- and lower-number pages within a word line.

In some cases, memory cells within the desired page may cause interference to one another. Thus, the group of interfered cells and the group of interfering cells may sometimes overlap.

Based on the updated information, the MSP subtracts the interference estimation from the read soft values, at an interference cancellation step 162, and computes the soft metrics, at a metric calculation step 164. The MSP then decodes the ECC, at a decoding step 166, and checks whether ECC decoding was successful, at a success checking step 168.

If the ECC was decoded successfully, the method terminates, at a success termination step 170, and the MSP typically extracts and outputs the data. Otherwise, the MSP checks whether the number of iterations (cycles) exceeds a predetermined maximum number, at an iteration number checking step 172. If the maximum number of iterations was exceeded, the method terminates without successfully reading the data, at an error termination step 174. Otherwise, the method loops back to reading step 160 above, and the MSP again determines whether to add another threshold or refine the interference estimation in the next cycle.

In both iterative methods of FIGS. 8 and 10 above, the MSP may select the number of new thresholds that are added at a particular iteration based on the values read from the cells or the data represented by these values. For example, when the MSP detects severe ECC failure or an exceptionally high level of interference, it may decide to add a high number of thresholds. The MSP may also determine the values (i.e., positions) of the new thresholds based on the read values or read data. For example, the values of new thresholds that are added in response to ECC failure may be different from the values of thresholds added in response to high interference.

Performing Multiple Read Operations Internally to the Memory Device

When using the methods and systems described above, the multiple comparison results associated with the multiple thresholds are typically communicated from memory device 24 to MSP 52. The resulting communication bandwidth between the memory device and the MSP may become prohibitive, especially when using a large number of threshold sets and/or when the number of nominal levels per memory cell is high. In some practical cases, the communication bandwidth over the interface between the MSP and the memory device may become the limiting factor that determines the memory access speed of system 20. This effect becomes even more severe when a single MSP 52 is connected to multiple memory devices 24.

In alternative embodiments of the present invention, some of the re-reading functions are carried out internally to the memory device, so as to reduce the communication bandwidth between the memory device and the MSP.

Figure 11:
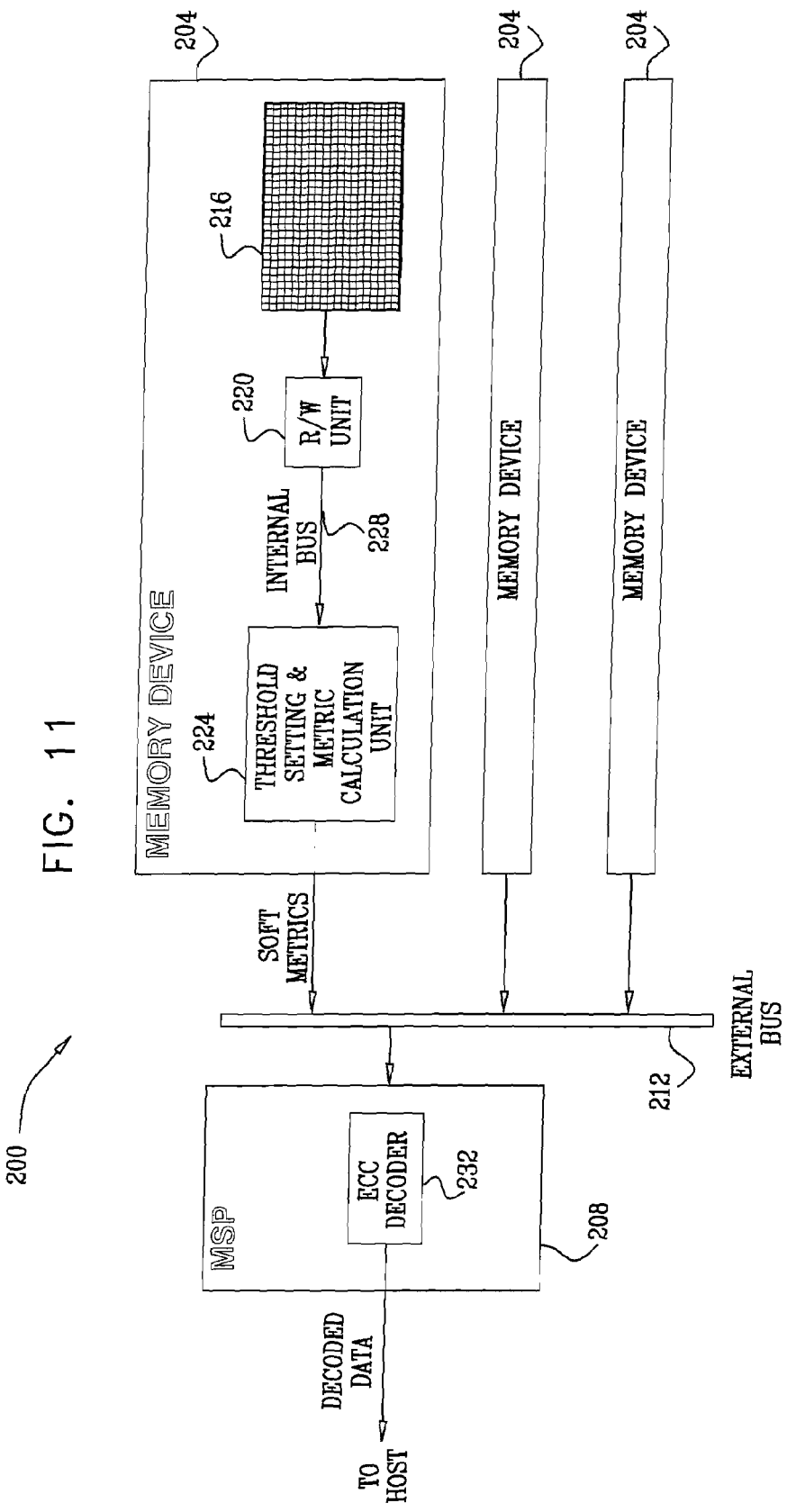
FIG. 11 is a block diagram that schematically illustrates a system for memory signal processing, in accordance with an alternative embodiment of the present invention.

FIG. 11 is a block diagram that schematically illustrates a system 200 for memory signal processing, in accordance with an alternative embodiment of the present invention. In the exemplary embodiment of FIG. 11, multiple memory devices 204 are connected to an MSP 208 over an external bus 212. Each memory device 204 comprises a memory cell array 216 and a R/W unit 220, which are similar to array 28 and R/W unit 40 of FIG. 1 above, respectively.

Unlike the embodiment shown in FIG. 1 above, each memory device 204 comprises a threshold setting and metric calculation unit 224, also referred to as "metric calculation unit" for brevity. Unit 224 is connected to R/W unit 220 by an internal bus 228. When the memory device accepts a request to retrieve data from a group of memory cells (e.g., a page), unit 224 controls R/W unit 220 to set the appropriate threshold values and read the memory cells using the thresholds, such as using any of the methods described above. The R/W unit carries out the multiple comparison operations and sends the corresponding comparison results to unit 224. Unit 224 computes the soft metrics based on the comparison results, and sends the metric values over external bus 212 to MSP 208.

MSP 208 comprises an ECC decoder 232. The ECC decoder accepts the soft metrics sent from unit 224 of memory device 204 and decodes the ECC based on the metrics. The MSP typically outputs the decoded data to the host system. When MSP 208 controls multiple memory devices 204, a single ECC decoder may decodes the data sent from all the memory devices. Alternatively, multiple ECC decoders may be used.

When using the configuration of FIG. 11, the communication bandwidth between the MSP and the memory device is significantly reduced in comparison with the configuration of FIG. 1 above, since individual comparison results are not communicated to the MSP. Instead, unit 224 sends the soft metric values, typically comprising a single value for each read memory cell. The large communication bandwidth needed to communicate the multiple comparison results is confined to internal bus 228, i.e., internally to the memory device. A high bandwidth bus of this sort is considerably simpler to implement internally to the memory device than between separate devices. Moreover, the traffic over the internal bus comprises only the traffic generated by the particular memory device, regardless of the number of memory devices controlled by the MSP.

The functional partitioning between R/W unit 220 and metric calculation unit 224 is an exemplary partitioning, which is chosen purely for the sake of conceptual clarity. In alternative embodiments, the reading, threshold comparison, threshold setting and metric computation functions can be partitioned in any other way, as desired. Thus, R/W unit 220, internal bus 228 and metric calculation unit 224 are collectively regarded as a reading circuit, which reads the analog memory cell and produces soft metrics.

As noted above, the soft metric computation sometimes takes into account estimation and cancellation of the interference in the read memory cells. In some embodiments, the interference estimation and cancellation functionality can also be carried out by the reading circuit internally to memory device 204, e.g., by unit 224. In these embodiments, unit 224 sends to the MSP soft metrics, in which the interference is already taken into account. Some aspects of carrying out signal processing functions internally to the memory device are described in U.S. Provisional Patent Application 60/917,653, cited above.

Although the embodiments described herein mainly address retrieving data from solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for operating a memory, comprising:
storing data, which is encoded with an Error Correction Code (ECC), in analog memory cells of the memory by writing to the analog memory cells respective analog input values that program the analog memory cells to a set of memory states;
reading the stored data multiple times from each analog memory cell by performing multiple read operations that compare analog output values of the analog memory cells to different, respective read thresholds so as to produce multiple comparison results for each of the analog memory cells, wherein the analog output values associated with each memory state lie in a respective analog value region, wherein analog value regions are separated by one or more boundary regions, and wherein at least two of the read thresholds are positioned in a boundary region between a pair of adjacent ones of the analog value regions;
computing soft metrics responsively to the multiple comparison results; and
decoding the ECC using the soft metrics, so as to extract the data stored in the analog memory cells.

2. The method according to claim 1, wherein each of the analog memory cells stores one or more bits of the data, and wherein each of the soft metrics corresponds to one of the bits.

3. The method according to claim 2, wherein each of at least some of the analog memory cells stores two or more bits of the data, wherein reading the data comprises, for each of the at least some of the analog memory cells, reading the two or more data bits in respective two or more decoding stages, and wherein computing the soft metrics comprises modifying a soft metric of a first bit read in a first decoding stage responsively to a value of a second bit read in a second decoding stage that precedes the first decoding stage.

4. The method according to claim 3, wherein modifying the soft metric comprises conditionally inverting the soft metric of the first bit depending on the value of the second bit.

5. The method according to claim 1, and comprising making an initial attempt to decode the ECC using an initial set of the read thresholds, such that no more than one of the read thresholds in the initial set is positioned in any given boundary region, and comparing the analog output values to the multiple read thresholds upon a failure of the initial attempt.

6. The method according to claim 1, wherein each comparison result has one of first and second possible values, and wherein computing the soft metrics comprises determining respective first and second counts of the comparison results having the first and second possible values, and computing the soft metrics based on the first and second counts.

7. The method according to claim 1, and comprising, upon failing to decode the ECC, adding one or more additional read thresholds to the multiple read thresholds, re-computing the soft metrics responsively to the additional read thresholds, and decoding the ECC using the re-computed soft metrics.

8. The method according to claim 7, wherein adding the additional threshold comprises progressively increasing a number of the read thresholds until a predetermined condition is met.

9. The method according to claim 1, wherein reading the data from a first group of the analog memory cells further comprises estimating interference caused to the first group by a second group of the analog memory cells and canceling the estimated interference.

10. The method according to claim 9, wherein canceling the estimated interference comprises modifying the soft metrics associated with the first group responsively to the estimated interference.

11. The method according to claim 9, and comprising, upon failing to decode the ECC in the first group, selecting whether to perform one of:
- re-reading the data in the second group, so as to re-estimate and cancel the interference;
- re-estimating the interference by reading the data in a third group of the memory cells; and
- adding one or more additional read thresholds and re-reading the data in the first group using the additional read thresholds.

12. The method according to claim 1, wherein computing the soft metrics comprises normalizing the soft metrics so as not to depend on a number of the read thresholds.

13. The method according to claim 1, wherein performing the multiple read operations comprises positioning the multiple read thresholds at non-uniform intervals with respect to one another.

14. The method according to claim 1, wherein the analog output values associated with each memory state are distributed in a respective statistical distribution, and wherein reading the stored data comprises positioning the at least two of the read thresholds about a midpoint between respective statistical distributions of the analog output values associated with the memory states represented by the adjacent analog value regions.

15. The method according to claim 1, wherein two or more of the comparison results for a given analog memory cell are inconsistent with one another.

16. A data storage apparatus, comprising:
- an interface, which is operative to communicate with a memory that includes a plurality of analog memory cells; and
- a memory signal processor (MSP), which is connected to the interface and is coupled to store data, which is encoded with an Error Correction Code (ECC), in the analog memory cells by writing respective input analog values that program the analog memory cells to a set of memory states, to read the stored data multiple times from each analog memory cell by performing multiple read operations that compare analog output values of the analog memory cells to different, respective read thresholds so as to produce multiple comparison results for each of the analog memory cells, wherein the analog output values associated with each memory state lie in a respective analog value region, wherein analog value regions are separated by one or more boundary regions, and wherein at least two of the read thresholds are positioned in a boundary region between a pair of, to compute soft metrics responsively to the multiple comparison results, and to decode the ECC using the soft metrics, so as to extract the data stored in the analog memory cells.

17. The apparatus according to claim 16, wherein each of the analog memory cells stores one or more bits of the data, and wherein each of the soft metrics corresponds to one of the bits.

18. The apparatus according to claim 17, wherein each of at least some of the analog memory cells stores two or more bits of the data, and wherein the MSP is coupled to read the two or more data bits in respective two or more decoding stages, and to modify a soft metric of a first bit read in a first decoding stage responsively to a value of a second bit read in a second decoding stage that precedes the first decoding stage.

19. The apparatus according to claim 18, wherein the MSP is coupled to conditionally invert the soft metric of the first bit depending on the value of the second bit.

20. The apparatus according to claim 16, wherein the MSP is coupled to make an initial attempt to decode the ECC using an initial set of the read thresholds, such that no more than one of the read thresholds in the initial set is positioned in any given boundary region, and to compare the analog output values to the multiple read thresholds upon failure of the initial attempt.

21. The apparatus according to claim 16, wherein each comparison result has one of first and second possible values, and wherein the MSP is coupled to determine respective first and second counts of the comparison results having the first and second possible values, and to compute the soft metrics based on the first and second counts.

22. The apparatus according to claim 16, wherein, upon failing to decode the ECC, the MSP is coupled to add one or more additional read thresholds to the multiple read thresholds, to recompute the soft metrics responsively to the additional read thresholds and to decode the ECC using the recomputed soft metrics.

23. The apparatus according to claim 22, wherein the MSP is coupled to progressively increase a number of the read thresholds until a predetermined condition is met.

24. The apparatus according to claim 16, wherein the MSP is coupled to estimate interference caused to a first group of the analog memory cells by a second group of the analog memory cells, and to cancel the estimated interference.

25. The apparatus according to claim 24, wherein the MSP is coupled to modify the soft metrics associated with the first group responsively to the estimated interference.

26. The apparatus according to claim 24, wherein, upon failing to decode the ECC in the first group, the MSP is coupled to select whether to perform one of:
- re-reading the data in the second group, so as to re-estimate and cancel the interference;
- re-estimating the interference by reading the data in a third group of the memory cells; and
- adding one or more additional read thresholds and re-reading the data in the first group using the additional read thresholds.

27. The apparatus according to claim 16, wherein the MSP is coupled to normalize the soft metrics so as not to depend on a number of read thresholds.

28. The apparatus according to claim 16, wherein the MSP is coupled to position the multiple read thresholds at non-uniform intervals with respect to one another.

29. The apparatus according to claim 16, wherein the analog output values associated with each memory state are distributed in a respective statistical distribution, and wherein the MSP is coupled to position the at least two of the read thresholds about a midpoint between respective statistical distributions of the analog output values associated with the memory states represented by the adjacent analog value regions.

30. The apparatus according to claim 16, wherein two or more of the comparison results for a given analog memory cell are inconsistent with one another.

31. A data storage apparatus, comprising:
- a memory device, comprising:

a plurality of analog memory cells, which are configured to store data, which is encoded with an Error Correction Code (ECC) and written to the analog memory cells as respective analog input values that program the analog memory cells to a set of memory states; and reading circuitry, which is coupled to read the stored data multiple times from each analog memory cell by performing multiple read operations that compare output analog values of the analog memory cells to different, respective read thresholds so as to produce multiple comparison results for each of the analog memory cells, wherein the analog output values associated with each memory state lie in a respective analog value region, wherein analog value regions are separated by one or more boundary regions, and wherein at least two of the read thresholds are positioned in a boundary region between a pair of adjacent ones of the analog value regions, to compute soft metrics responsively to the multiple comparison results, and to output the computed soft metrics; and a Memory Signal Processor (MSP) device, which is connected to the memory device and is coupled to accept the soft metrics computed by the reading circuitry, and to decode the ECC using the soft metrics.

32. A method for operating a memory, comprising:

storing data, which is encoded with an Error Correction Code (ECC), in a group of analog memory cells of the memory by writing to the analog memory cells in the group respective analog input values;

reading the data from the analog memory cells in the group by comparing analog output values of the analog memory cells in the group to one or more read thresholds, and applying ECC decoding to the read data; and upon a failure of the ECC decoding, canceling interference caused to the analog memory cells in the group by at least one other analog memory cell, and re-decoding the ECC.

33. A data storage apparatus, comprising:

an interface, which is operative to communicate with a memory that includes a plurality of analog memory cells; and a memory signal processor (MSP), which is connected to the interface and is coupled to store data, which is encoded with an Error Correction Code (ECC), in a group of analog memory cells of the memory by writing to the analog memory cells in the group respective analog input values, to read the data from the analog memory cells in the group by comparing analog output values of the analog memory cells in the group to one or more read thresholds, and applying ECC decoding to the read data, and, upon a failure of the ECC decoding, to cancel interference caused to the analog memory cells in the group by at least one other analog memory cell, and to re-decode the ECC.

* * * * *